(12) United States Patent
Tan et al.

(10) Patent No.: US 12,457,787 B2
(45) Date of Patent: Oct. 28, 2025

(54) POWER SEMICONDUCTOR DEVICE AND MANUFACTURING METHOD THEREOF

(71) Applicant: CHINA ELECTRONICS TECHNOLOGY GROUP CORPORATION NO.24 RESEARCH INSTITUTE, Chongqing (CN)

(72) Inventors: Kaizhou Tan, Chongqing (CN); Tian Xiao, Chongqing (CN); Jiahao Zhang, Chongqing (CN); Yonghui Yang, Chongqing (CN); Hequan Jiang, Chongqing (CN); Ruzhang Li, Chongqing (CN); Peijian Zhang, Chongqing (CN); Yi Zhong, Chongqing (CN); Peng Wang, Chongqing (CN); Yuxin Wang, Chongqing (CN); Xiaojun Fu, Chongqing (CN); Zhaohuan Tang, Chongqing (CN)

(73) Assignee: CHINA ELECTRONICS TECHNOLOGY GROUP CORPORATION NO.24 RESEARCH INSTITUTE, Chongqing (CN)

( * ) Notice: Subject to any disclaimer, the term of this patent is extended or adjusted under 35 U.S.C. 154(b) by 0 days.

(21) Appl. No.: 18/005,618

(22) PCT Filed: Jan. 21, 2022

(86) PCT No.: PCT/CN2022/073198
§ 371 (c)(1),
(2) Date: Jan. 16, 2023

(87) PCT Pub. No.: WO2023/133925
PCT Pub. Date: Jul. 20, 2023

(65) Prior Publication Data
US 2024/0250131 A1 Jul. 25, 2024

(30) Foreign Application Priority Data

Jan. 17, 2022 (CN) .......................... 202210048779.9

(51) Int. Cl.
*H10D 64/00* (2025.01)
*H10D 62/10* (2025.01)
(Continued)

(52) U.S. Cl.
CPC ......... *H10D 64/115* (2025.01); *H10D 62/109* (2025.01); *H10D 64/112* (2025.01);
(Continued)

(58) Field of Classification Search
CPC .. H10D 64/115; H10D 62/109; H10D 64/112; H10D 8/00; H10D 10/40;
(Continued)

(56) References Cited

U.S. PATENT DOCUMENTS

2006/0267091 A1 11/2006 Takahashi
2013/0292761 A1 11/2013 Yeh
(Continued)

FOREIGN PATENT DOCUMENTS

JP 2021118194 A * 8/2021 ........... H10D 62/128

*Primary Examiner* — Shahed Ahmed

(57) ABSTRACT

The disclosure provides a power semiconductor device and manufacturing method thereof. A plurality of second resistive field plate structures extending through an epitaxial layer in a first direction into a substrate are arranged in a termination region of the epitaxial layer and the plurality of second resistive field plate structures are arranged radially in a first plane. A plurality of tightly coupled second resistive field plates extending from a side close to a cell region to a side far away from the cell region form a more uniform three-dimensional electric field distribution diverging around the cell region, which optimizes a guiding and binding effect on a charge in a space depletion region of the
(Continued)

cell region and improves a withstand voltage performance of the whole power semiconductor device.

18 Claims, 20 Drawing Sheets

(51) Int. Cl.
    *H10D 8/00*         (2025.01)
    *H10D 10/40*       (2025.01)
    *H10D 12/00*       (2025.01)
    *H10D 30/66*       (2025.01)

(52) U.S. Cl.
    CPC ............... *H10D 8/00* (2025.01); *H10D 10/40* (2025.01); *H10D 12/441* (2025.01); *H10D 30/66* (2025.01)

(58) Field of Classification Search
    CPC .... H10D 12/441; H10D 30/66; H10D 12/481; H10D 30/60; H10D 30/665; H10D 30/668; H10D 30/021; H10D 62/106; H10D 62/112; H10D 62/393; H10D 64/111–117; H10D 30/655; H10D 30/0291–0297; H10D 84/613–617
    See application file for complete search history.

(56) References Cited

U.S. PATENT DOCUMENTS

2014/0167145 A1\*   6/2014   Ichinoseki ........... H10D 64/519
                                                                                   257/329
2019/0296116 A1\*   9/2019   Matsuba .............. H10D 64/112

\* cited by examiner

POWER SEMICONDUCTOR DEVICE AND MANUFACTURING METHOD THEREOF

CROSS REFERENCE TO RELATED APPLICATION

The present application is a continuation application of PCT Application No. PCT/CN2022/073198, filed on Jan. 21, 2022, which claims the benefit of priority to a Chinese Patent Application number CN202210048779.9, filed on Jan. 17, 2022, the disclosure of the above application is hereby incorporated by reference in its entirety for all purposes.

TECHNICAL FIELD

The disclosure relates to the technical field of semiconductor devices and integrated circuits, particularly to a Power semiconductor device and manufacturing method thereof.

BACKGROUND

Inspired by the superjunction technology based on PN junction charge balance, some scholars have discovered that the resistive field plate in the body has a superjunction effect similar to that of the PN junction, and proposed some active device structures based on the resistive field plate in the body, which have some advantages relative to PN junction-superjunction performance. Since the 1970s, resistive field plates have been applied to high-voltage power semiconductor devices, but they are mainly used on the surface or edge of high-voltage power semiconductor devices, and rarely used in the body.

At the same time, the active cell structure of high-voltage power semiconductor devices bears a relatively high voltage. In order to improve its withstand voltage performance, it is necessary to set up a withstand voltage termination structure on the periphery of the active cell structure. However, like the PN junction-superjunction structure, in the device structure, the active cell structure are preferred over the withstand voltage termination structure, and no withstand voltage termination structure based on internal resistive field plates has been found in the conventional art.

Therefore, how to provide a withstand voltage termination structure based on the resistive field plate in the body is an urgent technical problem to be solved at present.

SUMMARY

The disclosure provides a resistive field plate termination with a withstand voltage structure in the body.

The disclosure provides a power semiconductor device, the power semiconductor device includes:
a substrate with a front side and a back side arranged relatively;
an epitaxial layer, arranged on the front side of the substrate and including a cell region and a termination region arranged adjacently in a first plane, and the termination region surrounding the cell region;
an active region, arranged in the cell region and located at a top of the epitaxial layer, and a cell structure being formed therein;
a plurality of first resistive field plate structures, arranged in the cell region of the epitaxial layer, extending through the epitaxial layer in a first direction to the substrate, and extending in the first plane in a second direction;
a plurality of second resistive field plate structures, arranged in the termination region of the epitaxial layer, extending along the first direction through the epitaxial layer to the substrate, arranged radially in the first plane, and extending from a side near the cell region to a side away from the cell region;
a first electrode, arranged on the cell region of the epitaxial layer and ohmically contacting each first resistive field plate structure;
a second electrode, arranged on a side of the termination region of the epitaxial layer near the cell region, ohmically contacting each second resistive field plate structure, and surrounding the first electrode;
a third electrode, arranged on a side of the termination region of the epitaxial layer away from the cell region, ohmically contacting each second resistive field plate structure, and surrounding the second electrode; and
a fourth electrode, arranged on the back side of the substrate, ohmically contacting the plurality of the first resistive field plate structures and the plurality of the second resistive field plate structures respectively through the substrate; wherein
the first plane is parallel to the front side of the substrate, and the first direction is perpendicular to the first plane.

In an embodiment of the disclosure, in the first plane, the second resistive field plate structure at a corner of the termination region is set at 45° with the second direction.

In an embodiment of the disclosure, in the first plane, from the corner of the termination region to a flat edge of the termination region, at least one of the second resistive field plate structures is in a Y shape.

In an embodiment of the disclosure, in the first plane, a minimum distance between an electrical contact of the third electrode and an electrical contact of the second electrode is greater than or equal to a size of the first resistive field plate structure along the first direction.

In an embodiment of the disclosure, In the first plane, the plurality of the first resistive field plate structures are arranged in a third direction at equal distance according to a first distance, a minimum distance between two adjacent second resistive field plate structures is less than or equal to the first distance, and the third direction is perpendicular to the second direction.

In an embodiment of the disclosure, the power semiconductor device further includes a channel stop layer, the channel stop layer is arranged in the termination region of the epitaxial layer and is located on a top of the epitaxial layer, and a doping type of the channel stop layer is the same as that of the epitaxial layer.

In an embodiment of the disclosure, the power semiconductor device further includes a RESURF doping region, the RESURF doping region is arranged in the termination region of the epitaxial layer and is located on a top of the epitaxial layer, in the first plane, the RESURF doping region surrounds the active region, a potential of an inner edge of the RESURF doping region is equal to that of the cell structure in the active region, and an outer edge of the RESURF doping region is surrounded by the third electrode.

In an embodiment of the disclosure, the power semiconductor device further includes at least one of a withstand voltage ring, a resistive field plate, a field plate, and a variable doping termination structure.

In an embodiment of the disclosure, the cell structure at least includes a diode cell structure, a MOSFET cell structure, a bipolar transistor cell structure and an IGBT cell structure.

The disclosure provides a manufacturing method of a power semiconductor device, the method includes:

providing a substrate with a front side and a back side arranged relatively, forming an epitaxial layer on the front side of the substrate, the epitaxial layer including a cell region and a termination region adjacently arranged in a first plane, and the termination region surrounding the cell region;

forming an active region within the cell region of the epitaxial layer and forming a cell structure in the active region;

forming a plurality of first trenches in the cell region of the epitaxial layer, and forming a plurality of second trenches in the termination region of the epitaxial layer, the plurality of the first trenches passing through the active region and the epitaxial layer, and entering the substrate along a first direction, and the plurality of the second trenches passing through the epitaxial layer to the substrate along the first direction;

forming a first resistive field plate structure in each first trench, and forming a second resistive field plate structure in each second trench;

forming a first electrode, a second electrode and a third electrode independent of each other on the epitaxial layer, forming a fourth electrode on the back side of the substrate, the first electrode ohmically contacting each first resistive field plate structure, the second electrode ohmically contacting each second resistive field plate structure, the third electrode ohmically contacting each second resistive field plate structure, and the fourth electrode ohmically contacting each first resistive field plate structure and each second resistive field plate structure respectively through the substrate, wherein the first plane is parallel to the front side of the substrate, the first direction is perpendicular to the first plane, the plurality of the first trenches and the plurality of the second trenches are formed by the same process.

In an embodiment of the disclosure, after providing the substrate and forming the epitaxial layer and before forming the plurality of the first trenches and the plurality of the second trenches, the manufacturing method of the power semiconductor device further includes:

forming a RESURF doping region in the termination region of the epitaxial layer, in the first plane, the RESURF doping region surrounding the active region, an inner edge of the RESURF doping region overlapping an inner edge of the termination region, and an outer edge of the RESURF doping region being surrounded by an outer edge of the termination region; and forming a channel stop layer in the termination region of the epitaxial layer, and the channel stop layer overlapping the outer edge of the termination region.

In an embodiment of the disclosure, in the first plane, the plurality of the first trenches extend along a second direction in the first plane, the plurality of the first trenches are arranged at equal distance along a third direction according to a first distance, the plurality of the second trenches are arranged radially in the first plane, extend from a side close to the cell region to a side away from the cell region, and a minimum distance between two adjacent second trenches is less than or equal to the first distance, wherein the third direction is perpendicular to the second direction.

In an embodiment of the disclosure, in the first plane, the second trench at a corner of the termination region is set at 45° with the second direction.

In an embodiment of the disclosure, in the first plane, from a corner of the termination region to a flat edge of the termination region, at least one of the second trenches is in a Y shape.

In an embodiment of the disclosure, forming the first resistive field plate structure in the first trench and forming the second resistive field plate structure in the second trench further includes:

forming a field plate dielectric layer in the first trench and the second trench respectively, removing the field plate dielectric layer at a bottom of the first trench and a bottom of the second trench;

filling the first trench and the second trench with semi-insulating polysilicon material respectively, the semi-insulating polysilicon material in the first trench and the field plate dielectric layer at a sidewall in the first trench constitute the first resistive field plate structure, and the semi-insulating polysilicon material in the second trench and the field plate dielectric layer at the sidewall in the second trench constitute the second resistive field plate structure.

In an embodiment of the disclosure, forming the first electrode, the second electrode and the third electrode independent of each other on the epitaxial layer and forming the fourth electrode on the back side of the substrate further includes:

forming an isolation dielectric layer on the epitaxial layer;

etching the isolation dielectric layer, forming a plurality of first openings on the cell region of the epitaxial layer, forming a second opening and a third opening independent of each other on the termination region of the epitaxial layer, the third opening surrounding the second opening, the plurality of the first openings exposing tops of the plurality of the first resistive field plate structures in one-to-one correspondence, and the second opening and the third opening respectively exposing tops of the second resistive field plate structures;

forming a first metal layer on the isolation dielectric layer;

etching the first metal layer, forming the first electrode, the second electrode and the third electrode, the first electrode ohmically contacting with the top of each of the first resistive field plate structures through the first opening, the second electrode ohmically contacting with the top of each of the second resistive field plate structures through the second opening, the third electrode ohmically contacting with the top of each of the second resistive field plate structures through the third opening; and forming a second metal layer on the back side of the substrate to obtain the fourth electrode, the fourth electrode ohmically contacting with a bottom of each of the first resistive field plate structures and a bottom of each of the second resistive field plate structures through the substrate respectively.

In an embodiment of the disclosure, the plurality of the first openings extend along the second direction in the first plane, and the plurality of the first openings are arranged at intervals in the first plane along the third direction.

In an embodiment of the disclosure, in the first plane, a minimum distance between the third opening and the second opening is greater than or equal to a size of the first resistive field plate structure along the first direction.

The power semiconductor device and manufacturing method thereof of the disclosure have the following beneficial effects:

A plurality of second resistive field plate structures extending through an epitaxial layer in a first direction into a substrate are arranged in a termination region of the epitaxial layer and the plurality of second resistive field plate structures are arranged radially in a first plane. A plurality of tightly coupled second resistive field plates extending from a side close to a cell region to a side far away from the cell region form a more uniform three-dimensional electric field distribution diverging around the cell region, which optimizes a guiding and binding effect of the termination region on a charge in a space depletion region of the cell region, thereby improving a withstand voltage performance of the whole power semiconductor device;

The second resistive field plate structure in the termination region and a first resistive field plate structure in the cell region are both of a second generation super junction technology based on an internal resistive field plate, which enables a process of the cell region to be compatible with that of the termination region and has low manufacturing cost and low process difficulty;

A use of modern 2.5-dimensional machining technology based on deep trench etching is beneficial to a miniaturization and high-density of structures, which is more suitable for a development direction of modern integrated semiconductor devices more than Moore.

PART NUMBER DESCRIPTION

Figure 1:
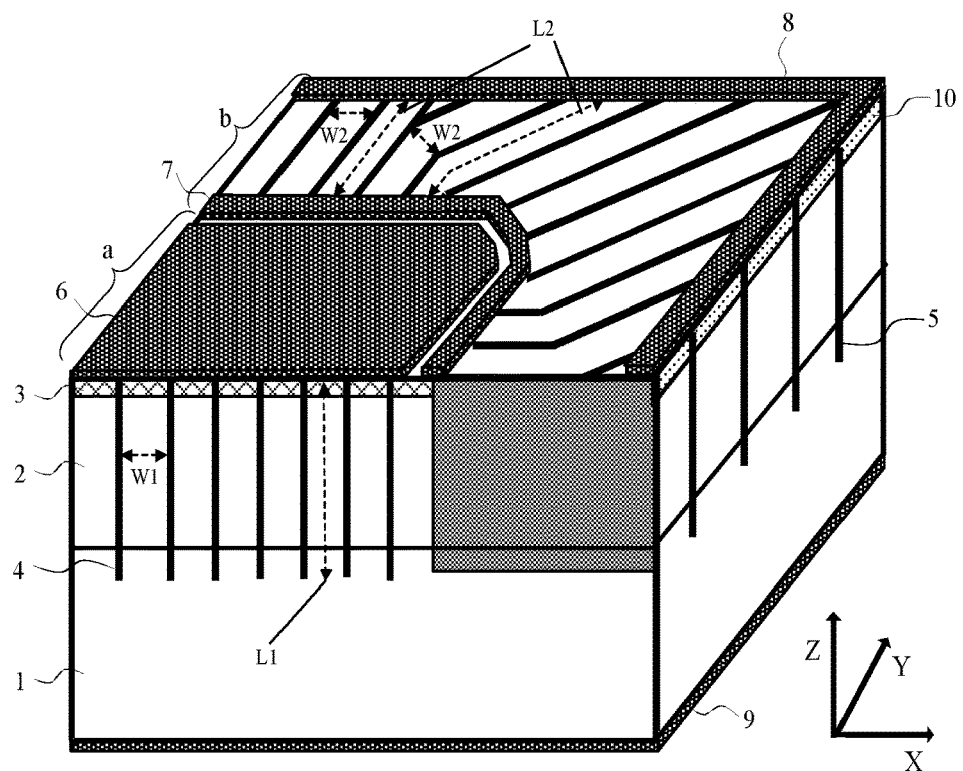
FIG. 1 is a schematic structural view of a power semiconductor device in an embodiment 1 of the disclosure.
Figure 2:
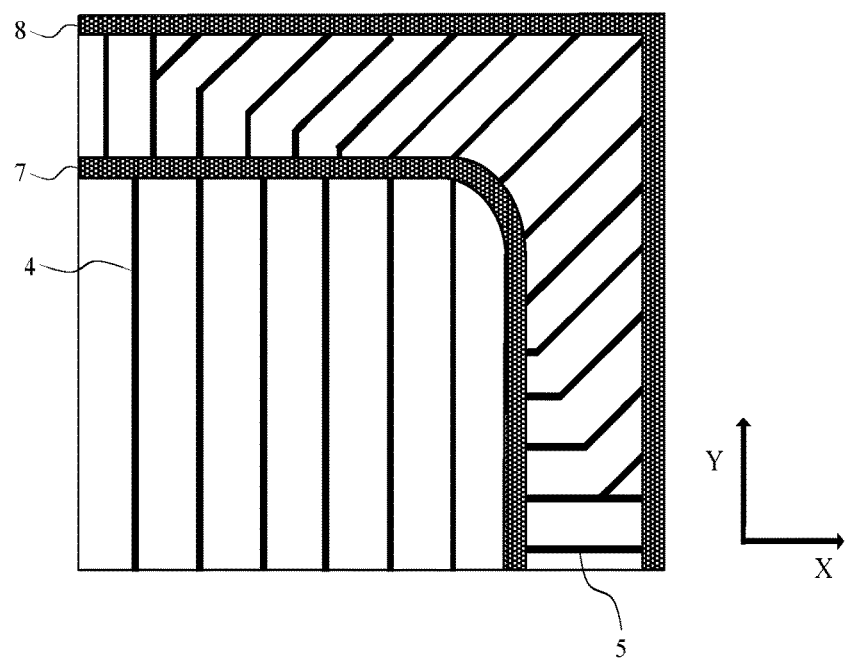
FIG. 2 through FIG. 6 are schematic views of shapes and structures of a second electrode 7 and a third electrode 8 on the power semiconductor device in other embodiments of the disclosure.
Figure 3:
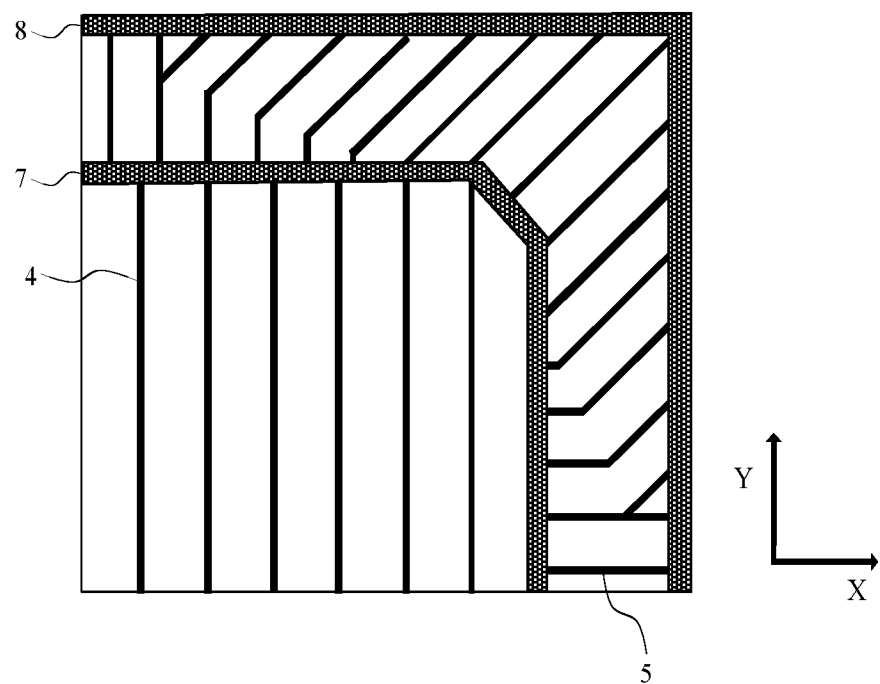
Figure 4:
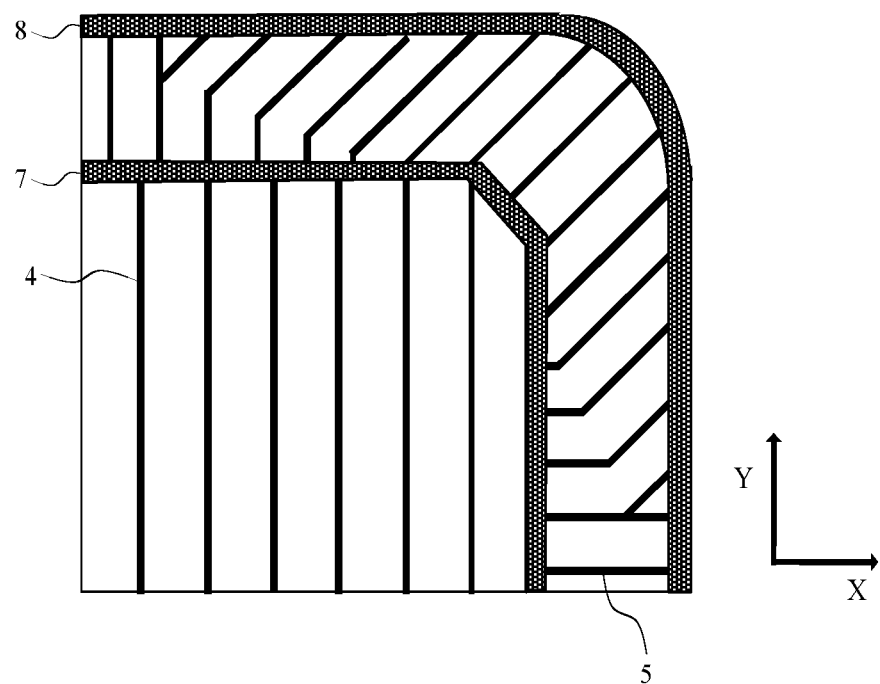
Figure 5:
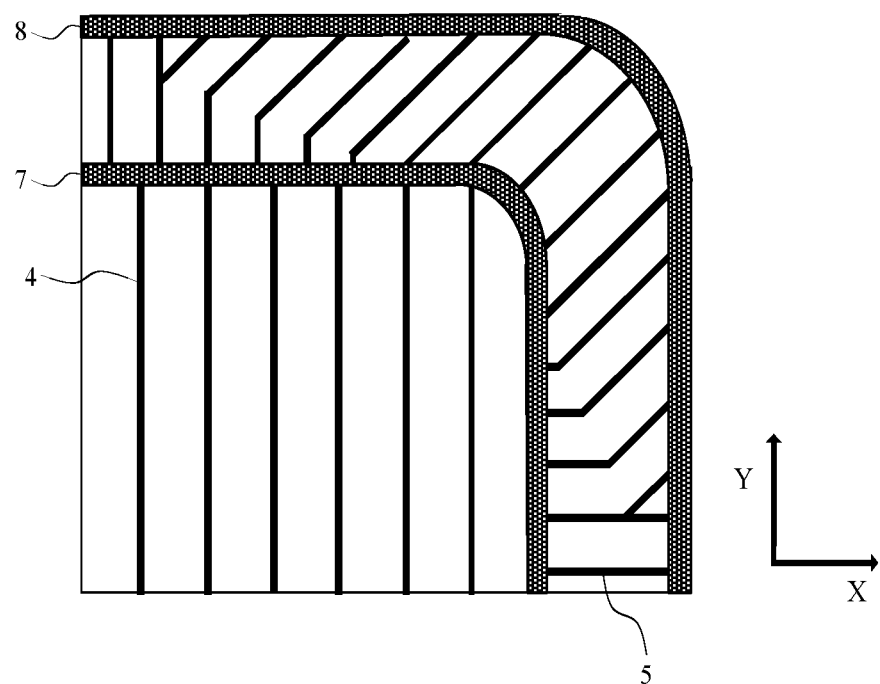
Figure 6:
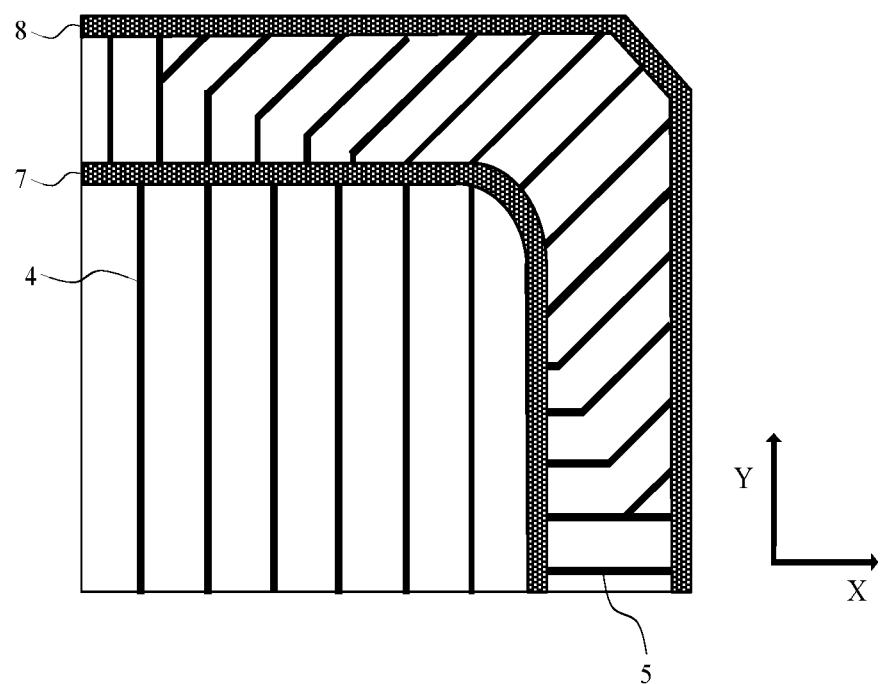

1—substrate, 2—epitaxial layer, 3—active region, 4—first resistive field plate structure, 5—second resistive field plate structure, 6—first electrode, 7—second electrode, 8—third electrode, 9—fourth electrode, 10—channel stop layer, 11—isolation dielectric layer, 12—first metal layer, 13—second metal layer, 14—RESURF doping, 00—field plate dielectric layer, 01—semi-insulating polysilicon material, 20—top of dielectric layer, a—cell region of epitaxial layer 2, b—termination region of epitaxial layer 2, T1—first trench, T2—second trench, D1—size of first trench T1 along third direction (trench width), L1—size of first trench T1 along first direction, L2—minimum length of second trench T2 in first plane, W1—distance between two adjacent first resistive field plate structures 4 in first plane (first distance), W2—minimum distance between two adjacent second resistive field plate structures 5 (or second trench T2) in first plane, K1—first opening, K2—second opening, K3—third opening.

DETAILED DESCRIPTION

Inventors found that: in conventional superjunction structure devices or superjunction-like structure devices, an optimization of a device breakdown voltage is mostly concentrated inside a cell structure, while peripheral termination structures are mostly arranged on surfaces of the devices, which has a limited effect on improving a withstand voltage performance of the device.

The disclosure provides a technical scheme of a termination withstand voltage based on an internal resistive field plate. Multiple internal resistive field plate structures are formed in the peripheral termination region surrounding a cell region. A plurality of second resistive field plate structures are arranged radially to surroundings from an outer edge of the cell region, and a more uniform three-dimensional electric field distribution that diverges to the surroundings is formed by multiple tightly coupled second resistive field plates, which optimizes a guiding and binding effect of a termination region on a charge in a space depletion region of the cell region, thereby improving the withstand voltage performance of a power semiconductor device.

The following describes the implementation of the disclosure through specific embodiments, and those skilled in the art can easily understand other advantages and effects of the disclosure from the content disclosed in this specification. The disclosure may also be implemented or applied through other different specific embodiments. Various details in this specification may also be modified or changed based on different viewpoints and applications without departing from the disclosure.

Please refer to FIG. 1 through FIG. 40. It should be noted that figures provided in these embodiments only illustrate a basic idea of the disclosure in a schematic manner. The figures only show the assemblies related to the disclosure instead of drawing according to number, shape and size of the assemblies in actual implementation. In its actual implementation, type, quantity, and ratio of each assembly may be changed at will, and its assembly layout type may also be more complicated. It should be noted that the structure, scale, size, etc. of the drawings in this specification are merely for illustration of the disclosed content for understanding and reading by those skilled in the art, and do not intend to limit the restrictive conditions under which the disclosure can be implemented, so it has no technical significance. Any structural modification, proportional relationship change or size adjustment should still be within the scope of the technical content disclosed in the disclosure, without affecting the effects and objectives that can be achieved by the disclosure.

Embodiment 1

Please refer to FIG. 1. The disclosure provides a power semiconductor device, including:

a substrate 1 with a front side and a back side arranged relatively;

an epitaxial layer 2, arranged on the front side of the substrate 1 and including a cell region a and a termination region b arranged adjacently in a first plane, and the termination region b surrounding the cell region;

an active region 3, arranged in the cell region a and located at a top of the epitaxial layer 2, and a cell structure being formed therein;

a plurality of first resistive field plate structures 4, arranged in the cell region a of the epitaxial layer 2, extending through the epitaxial layer 2 in a first direction (Z-axis direction in FIG. 1) to the substrate 1, and extending in the first plane (X-Y plane in FIG. 1) in a second direction (Y-axis direction in FIG. 1);

a plurality of second resistive field plate structures 5, arranged in the termination region b of the epitaxial layer 2, extending along the first direction through the epitaxial layer 2 to the substrate 1, arranged radially in the first plane, and extending from a side near the cell region a to a side away from the cell region a;

a first electrode 6, arranged on the cell region a of the epitaxial layer 2 and ohmically contacting each first resistive field plate structure 4;

a second electrode 7, arranged on a side of the termination region b of the epitaxial layer 2 near the cell region a, ohmically contacting each second resistive field plate structure 5, and surrounding the first electrode 6;

a third electrode 8, arranged on a side of the termination region b of the epitaxial layer 2 away from the cell region a, ohmically contacting each second resistive field plate structure 5, and surrounding the second electrode 7; and a fourth electrode 9, arranged on the back side of the substrate 1, ohmically contacting each first resistive field plate structure 4 and each second resistive field plate structure 5 respectively through the substrate 1;

wherein the first plane is parallel to the front side of the substrate 1, and the first direction is perpendicular to the first plane.

In some embodiments, please refer to FIG. 1. The epitaxial layer 2 includes a cell region a and a termination region b adjacently arranged in the first plane, and the termination region b surrounds the cell region a. It should be noted that only ¼ part of the whole power semiconductor device is shown in FIG. 1, and a structure of a remaining part is the same as that of the ¼ part.

In some embodiments, please refer to FIG. 1. The active region 3 is formed in the cell region a of the epitaxial layer 2, and the cell structure is formed in the active region 3. The cell structure at least includes a diode cell structure, a MOSFET cell structure, a bipolar transistor cell structure and an IGBT cell structure, which is not limited here.

In some embodiments, please refer to FIG. 1. The power semiconductor device further includes a channel stop layer 10. The channel stop layer 10 is arranged in the termination region b of the epitaxial layer 2 and is located on a top of the epitaxial layer 2. A doping type of the channel stop layer 10 is the same as that of the epitaxial layer 2 and the channel stop layer 10 is substantially equipotential with the third electrode 9 when the device is turned off.

In some embodiments, please refer to FIG. 1. In the first plane, the second resistive field plate structure 5 at a corner of the termination region b is set at 45° with the second direction. In the first plane, from a corner of the termination region b to a flat edge of the termination region b, at least one of the second resistive field plate structures 5 is in a Y shape.

In some embodiments, please refer to FIG. 1. In the first plane, a minimum distance L2 between an electrical contact of the third electrode 8 and an electrical contact of the second electrode 7, which means an electrified distance of the second resistive field plate structure 5 in the first plane, is greater than or equal to a size L1 of the first resistive field plate structure 4 along the first direction.

In some embodiments, please refer to FIG. 1. In the first plane, the plurality of the first resistive field plate structures 4 are arranged in a third direction (X-axis direction in FIG. 1) at equal distance according to a first distance W1, a minimum distance W2 between two adjacent second resistive field plate structures 5 is less than or equal to the first distance W1, and the third direction is perpendicular to the second direction.

In some embodiments, in the first plane, a shape of the second electrode 7 at a corner is not limited to a broken line shown in FIG. 1, but may also be a ¼ arc, a ¼ ellipse, or a tangent angle, instead of a right angle. Please refer to FIG. 2 through FIG. 6, an electric field distribution at the corner is optimized to reduce an impact of tip discharge. Correspondingly, a shape of the third electrode 8 at the corner is not limited to a right-angle shape shown in FIG. 1, and may also be an arc, an ellipse, a broken line or a tangent angle, etc., which is not limited here and it is only required that L2≥L1.

Figure 7:
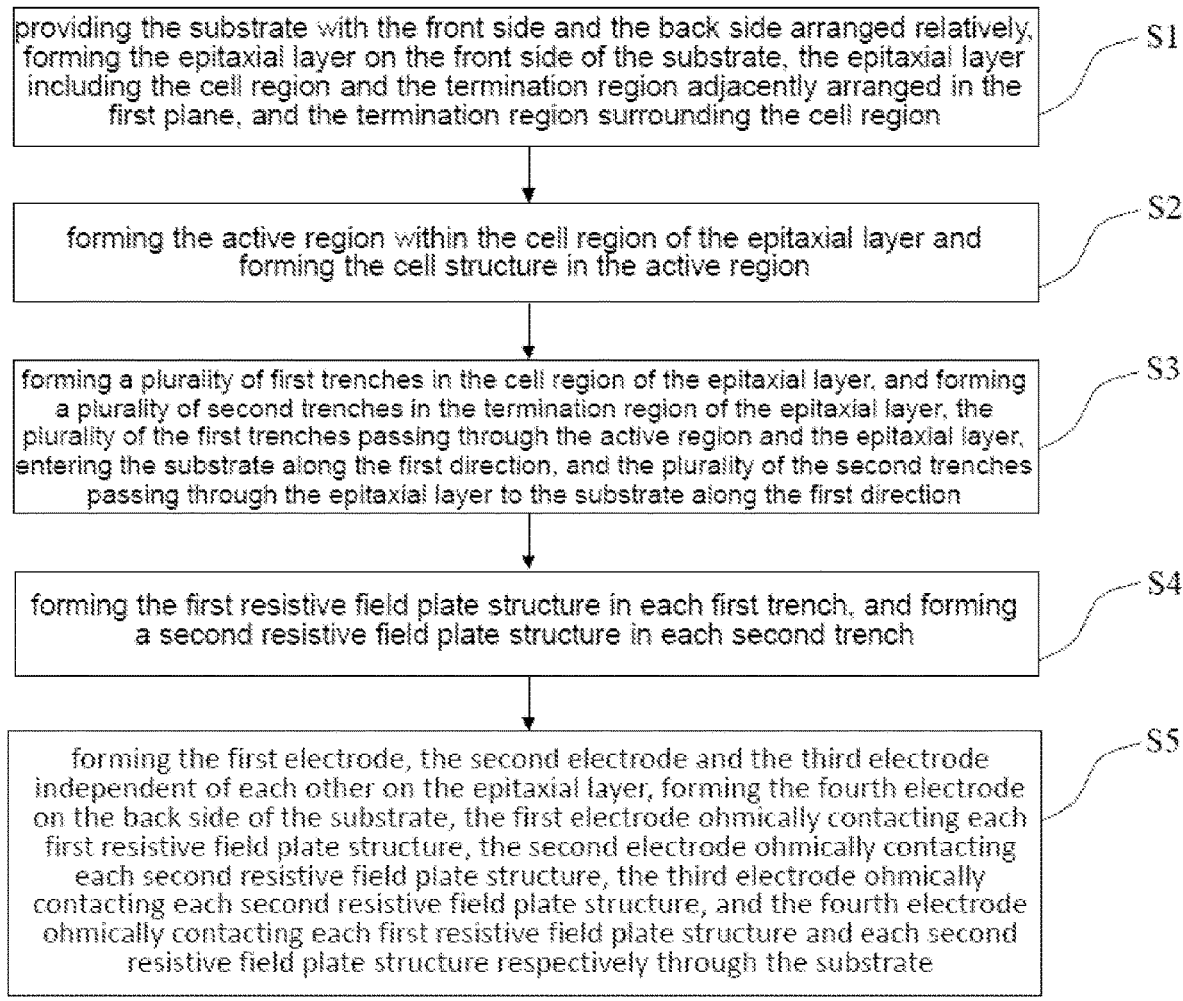
FIG. 7 is a schematic view of operations of a manufacturing method of the power semiconductor device in the embodiment 1 of the disclosure.

At the same time, please refer to FIG. 7. The disclosure further provides a manufacturing method of a power semiconductor device, the method includes:

S1: providing the substrate 1 with the front side and the back side arranged relatively, forming the epitaxial layer 2 on the front side of the substrate 1, the epitaxial layer 2 including the cell region a and the termination region b adjacently arranged in the first plane, and the termination region b surrounding the cell region a;

S2: forming the active region 3 within the cell region a of the epitaxial layer 2 and forming the cell structure in the active region 3;

S3: forming a plurality of first trenches T1 in the cell region a of the epitaxial layer 2, and forming a plurality of second trenches T2 in the termination region b of the epitaxial layer 2, the plurality of the first trenches T1 passing through the active region 3 and the epitaxial layer 2, and entering the substrate 1 along the first direction, and the plurality of the second trenches T2 passing through the epitaxial layer 2 to the substrate 1 along the first direction;

S4: forming the first resistive field plate structure 4 in each first trench T1, and forming a second resistive field plate structure 5 in each second trench T2; and S5: forming the first electrode 6, the second electrode 7 and the third electrode 8 independent of each other on the epitaxial layer 2, forming the fourth electrode 9 on the back side of the substrate 1, the first electrode 6 ohmically contacting each first resistive field plate structure 4, the second electrode 7 ohmically contacting each second resistive field plate structure 5, the third electrode 8 ohmically contacting each second resistive field plate structure 5, and the fourth electrode 9 ohmically contacting each first resistive field plate structure 4 and each second resistive field plate structure 5 respectively through the substrate 1, wherein the first plane is parallel to the front side of the substrate 1, the first direction is perpendicular to the first plane, the plurality of the first trenches T1 and the plurality of the second trenches T2 are formed by the same process.

An implementation of the disclosure will be described below by taking high-voltage diodes (which means that the cell structure in the cell region a is a diode cell structure) as an example, and other ways that may realize characteristics of the disclosure should not be considered to be different from the disclosure. A specific formation process of the internal resistive field plate with deep trench has been described in detail in our previous published patent applications, and other processes are familiar to those skilled in the art. The disclosure will not specifically describe technical details of specific internal resistive field plate with deep trench here, but only reasonably describe a main process methods, so as to illustrate necessary process operations and methods for realizing the aforementioned termination structure in the embodiment. Processes described in following examples are all conventional mature processes, and will not be described in detail, which is understood by ordinary technicians in industry.

Before executing a manufacturing process, at first, a critical size and shape structure of the power semiconductor device is designed. Through a computer-aided design, it is determined that the first distance W1 along the third direction between two adjacent first resistive field plate structures 4 in the active region 3 is selected as 5 µm. The minimum distance W2 between two adjacent second resistive field plate structures 5 in the termination region b around the active region 3 is selected as 90% of 5 µm, which means 4.5 µm. The size (or depth) L1 of the first resistive field plate structure 4 (and the second resistive field plate structure 5) along the first direction is 22 µm. The minimum distance L2 between the third electrode 8 and the second electrode 7 in the first plane is also a minimum length of the second resistive field plate structure 5 in the first plane. According to a rule that L2 is greater than or equal to L1 and combined with the computer-aided design, L2 is taken as 30 µm. At the corner of the termination region b, in the first plane, the second resistive field plate structure 5 at the corner of the cell region b is set at 45° with the second direction.

Figure 8:
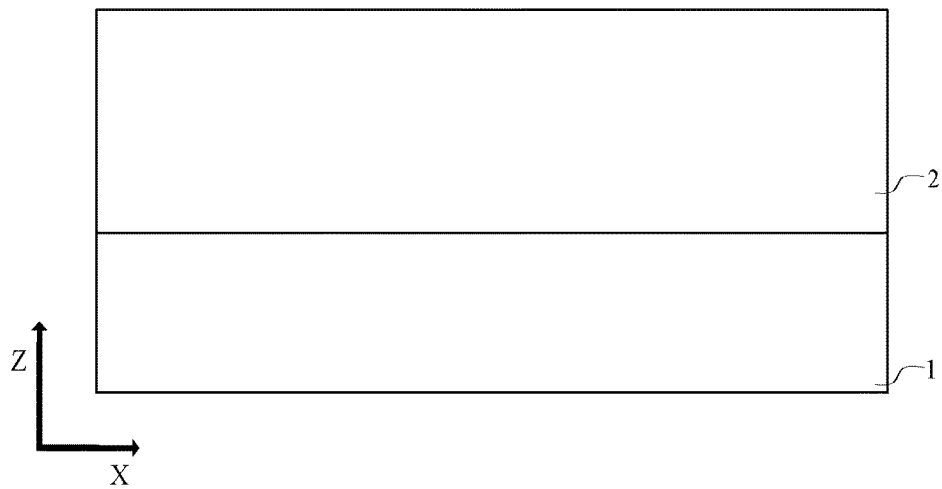
FIG. 8 through FIG. 39 are process flowcharts of the manufacturing method of the power semiconductor device in the embodiment 1 of the disclosure.

In some embodiments, please refer to FIG. 8. In S1, the substrate 1 is provided as a drain region of the device, which is an N-type doping semiconductor material (such as silicon, silicon carbide, gallium arsenide, etc.). The epitaxial layer 2 is formed on the substrate 1 as a drift region of the device, and the epitaxial layer 2 is also N-type doping semiconductor material. Wherein, the substrate 1 is heavily doped, and the epitaxial layer 2 is lightly doped. A thickness of the epitaxial layer 2 may be flexibly designed depending on a situation. For example, for a breakdown voltage of 300V, the thickness of the epitaxial layer 2 may be designed to be 20 µm to meet a requirement that a bottom of the first resistive field plate structure 4 enters the substrate 1, which is determined by a verification of the computer-aided design, and a doping concentration is selected as $2.8 \times 10^{15}$ $cm^{-1}$.

In some embodiments, please refer to FIG. 1 through FIG. 6. The epitaxial layer 2 includes the cell region a and the termination region b adjacently arranged in the first plane, and the termination region b surrounds the cell region a. It should be noted that only ¼ part of the whole power semiconductor device is shown in FIG. 1, and the structure of the remaining part is the same as that of the ¼ part.

In some embodiments, between S1 and S2, the manufacturing method of the power semiconductor device further includes an operation: forming a photolithography alignment mark on the epitaxial layer 2 by using a common method in the industry, so as to facilitate an alignment in subsequent process operations.

Figure 9:
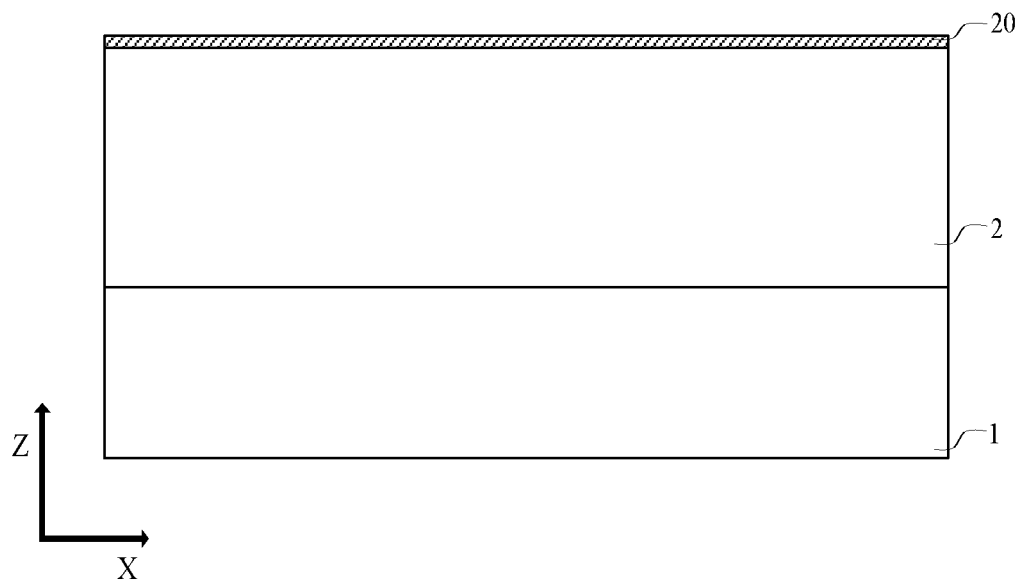

In some embodiments, please refer to FIG. 9. Between S1 and S2, the manufacturing method of the power semiconductor device further includes: a top dielectric layer 20 is obtained by oxidizing the top of the epitaxial layer 2 through a common process, such as wet oxidation at 950° C. for 20 minutes, to obtain the top dielectric layer 20 with a thickness of about 60 nm±10 nm.

Figure 10:
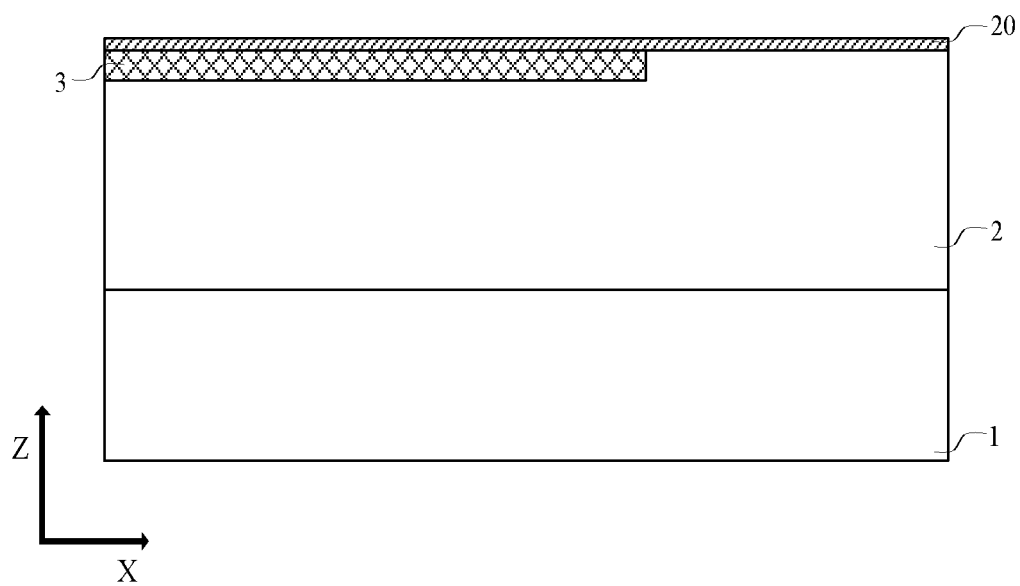

In some embodiments, please refer to FIG. 10. In S2, the active region 3 is formed in the cell region a of the epitaxial layer 2, and the cell structure (not shown in the figure) is formed in the active region 3.

In some embodiments, please refer to FIG. 10. A first ion implantation and a first ion diffusion is performed to form the active region 3 in the cell region a on the top of the epitaxial layer 2: the first ion implantation is performed first, since it is a simple diode as an example to illustrate the disclosure, and a photolithography of the active region 3 of the device may be simply performed, such as boron implantation with photoresist, and an implantation condition is 100 Kev with $5 \times 10^{14}$ $cm^{-2}$. Then, the first ion diffusion is performed under a protection of an inert gas for an impurity diffusion and activation, such as an ion diffusion at 1050° C. for 90 minutes, so as to form the active region 3 in the cell region a on the top of the epitaxial layer 2.

Wherein, the cell structure formed in the active region 3 may be a diode cell structure, a MOSFET cell structure, a bipolar transistor cell structure with a small injection of minority carrier, and an IGBT cell structure (for an IGBT, at least part of the substrate is a P-type doping), which is not limited here.

Figure 11:
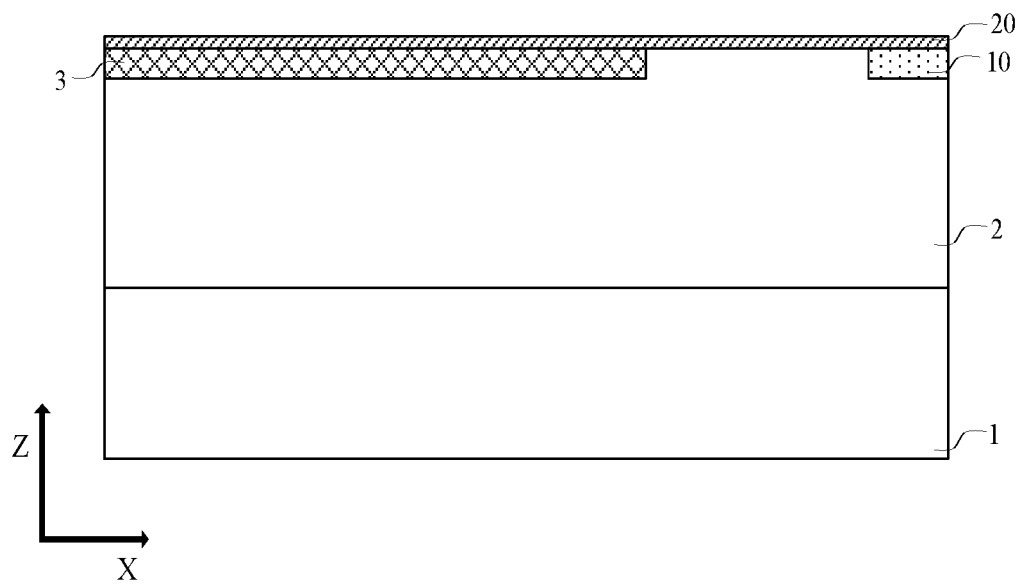

In some embodiments, please refer to FIG. 11. Between S2 and S3, the manufacturing method of the power semiconductor device further includes: first performing a photolithography of the channel stop layer 10, using a photoresist as a shielding mask for phosphorus ion implantation. An implantation conditions is $5 \times 10^{15}$ $cm^{-2}$, 170 Kev. The channel stop layer 10 is formed in the termination region b of the extension layer 2, and the channel stop layer 10 overlaps an outer edge of the termination region b.

Figure 12:
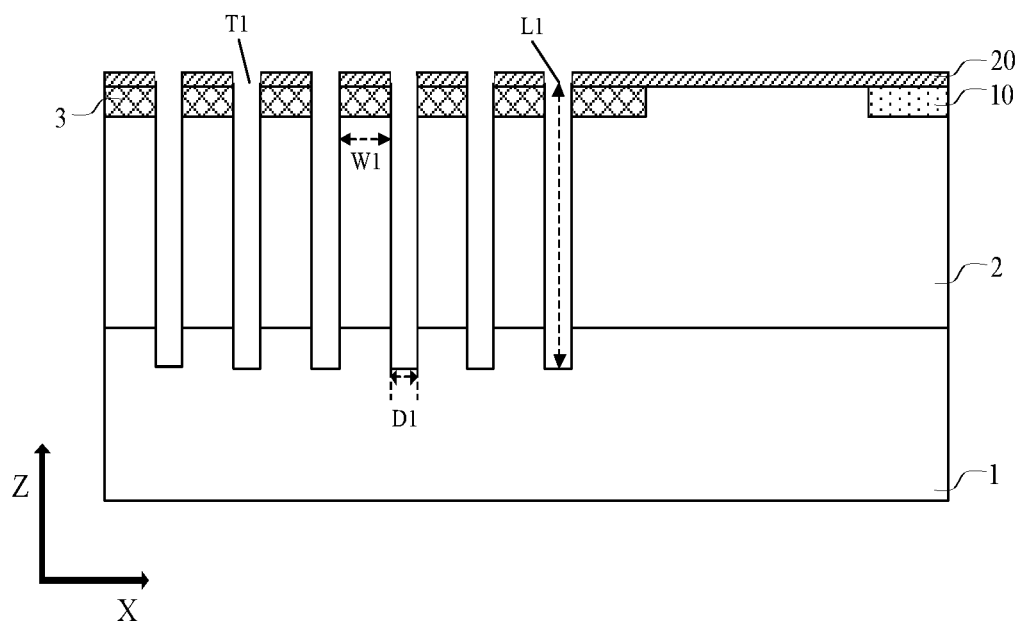

In some embodiments, please refer to FIG. 12. In S3, the plurality of first trenches T1 are formed in the cell region a of the epitaxial layer 2, and the plurality of second trenches T2 are formed in the termination region b of the epitaxial layer 2. The first trench T1 passes through the active region 3 and the epitaxial layer 2 along the first direction and enters the substrate 1, and the second trench T2 passes through the epitaxial layer 2 along the first direction and enters the substrate 1.

Figure 13:
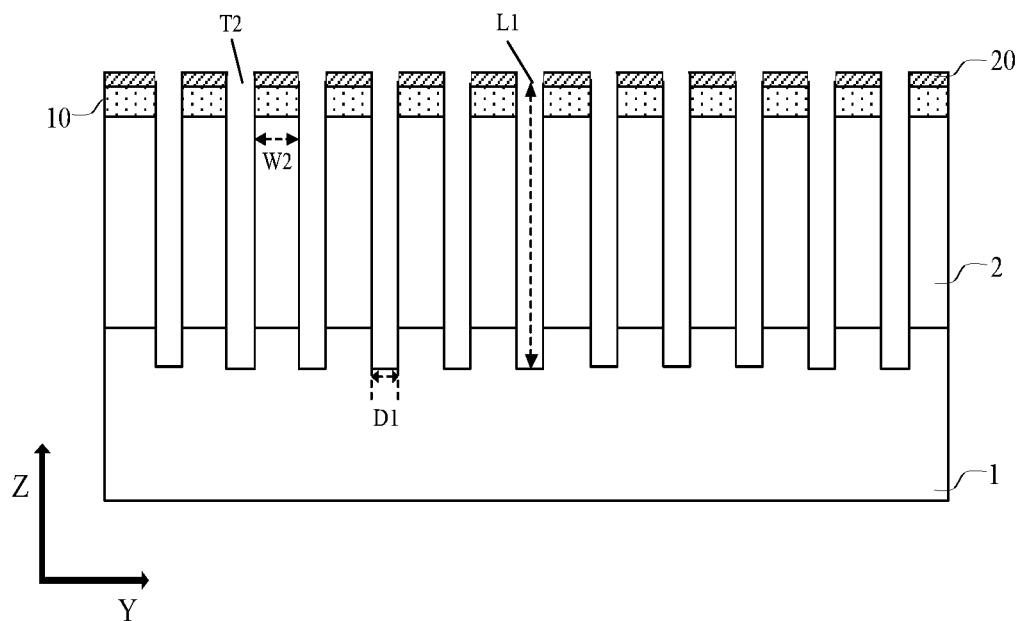

In some embodiments, please refer to FIG. 12 and FIG. 13. A photolithography machine and a corresponding photolithography plate are used to expose positions of the first resistive field plate structure 4 and the second resistive field plate structure 5, and then a dry etching process is used to sequentially etch the field plate dielectric layer 20, the epitaxial layer 2 and the substrate 1. Simultaneously the first trench T1 and the second trench T2 are formed. A depth L1 of the first trench T1 (or the second trench T2) vertically entering the epitaxial layer 2 and the substrate 1 is 22 µm, and a width D1 of the first trench (or the second trench T2) is 0.8 µm~1.2 µm. It should be noted that the plurality of second trenches T2 of the termination region b do not need to pass through the channel stop layer 10 although FIG. 13 is given by it.

Figure 14:
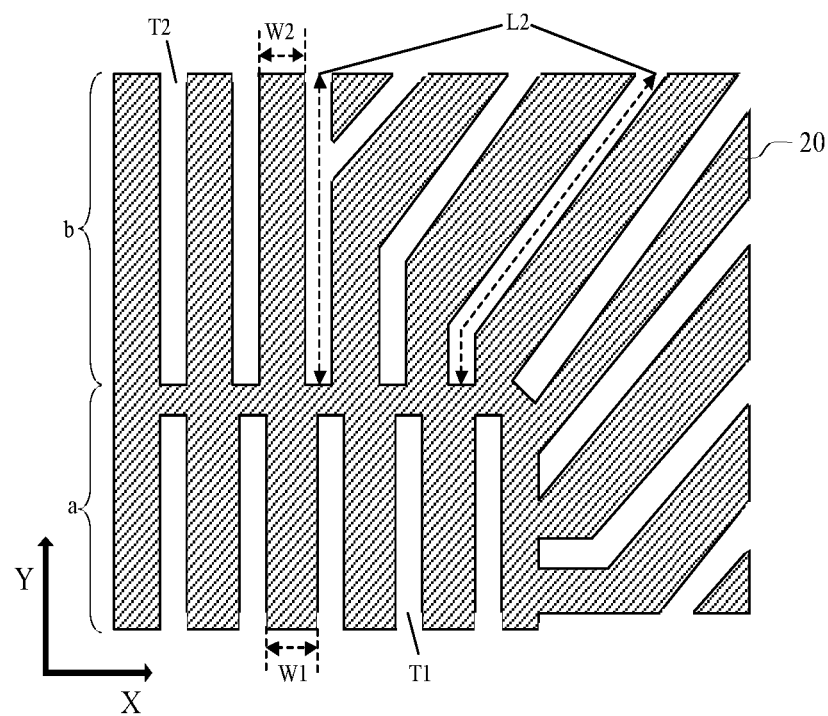

In some embodiments, please refer to FIG. 14. In the first plane, the plurality of the first trenches T1 extend along a second direction in the first plane, the plurality of the first trenches are arranged at equal distance along a third direction according to a first distance W1. In the termination region b, the plurality of the second trenches T2 are arranged radially, extend from a side close to the cell region a to a side away from the cell region a, and a minimum distance W2 between two adjacent second trenches T2 is less than or equal to the first distance W1.

In some embodiments, please refer to FIG. 12 through FIG. 14. The first distance W1 along the third direction between two adjacent first trenches T1 in the active region 3 is selected as 5 µm. The minimum distance W2 between two adjacent second trenches T2 in the termination region b around the active region 3 is selected as 90% of 5 µm, which means 4.5 µm. It means that W1>W2.

In some embodiments, please refer to FIG. 14. The minimum length L2 of the second trench T2 in the first plane is 30 µm, which is greater than the depth L1 of the first trench T1 (or the second trench T2) along the first direction. At the corner of the termination region b, in the first plane, the second trench T2 at the corner of the cell region b is set at 45° with the second direction. At the same time, in the first plane, at least one of the second trenches T2 is Y-shaped at a transition from the corner of the termination region b to the flat edge of the termination region b.

Figure 15:
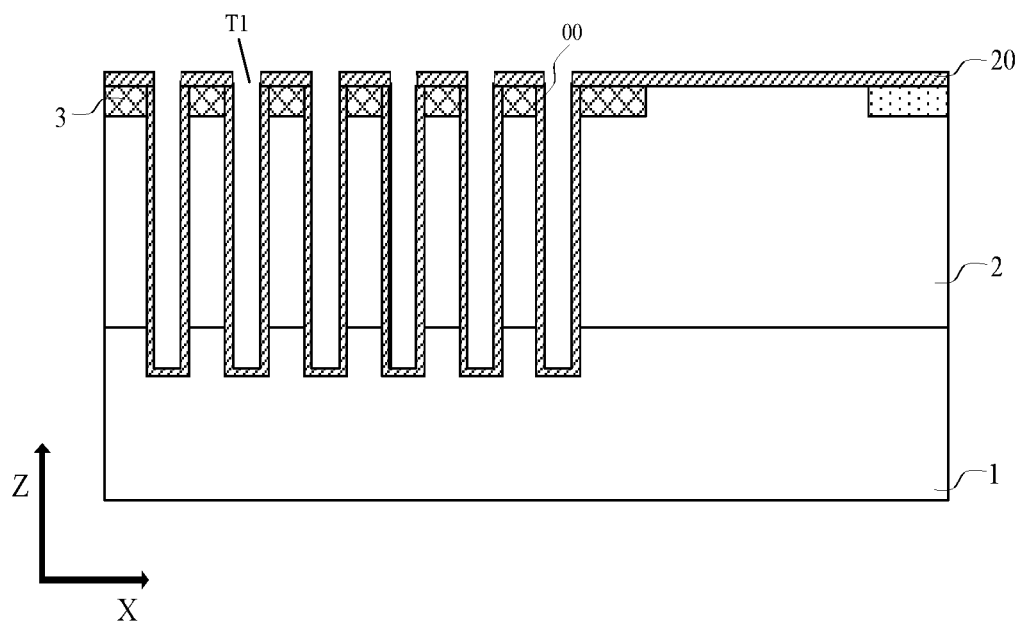
Figure 16:
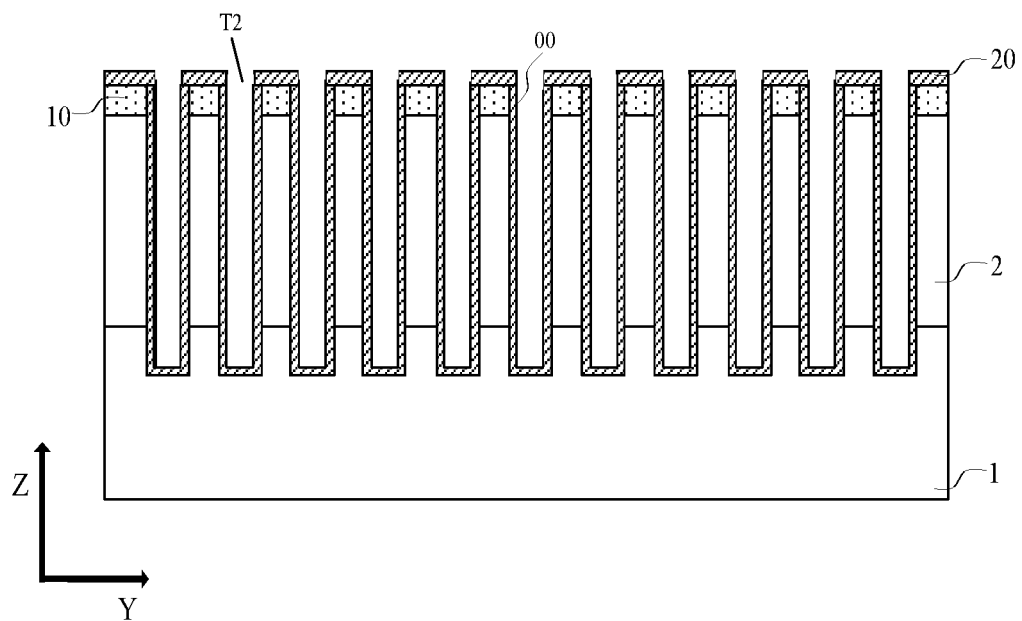
Figure 17:
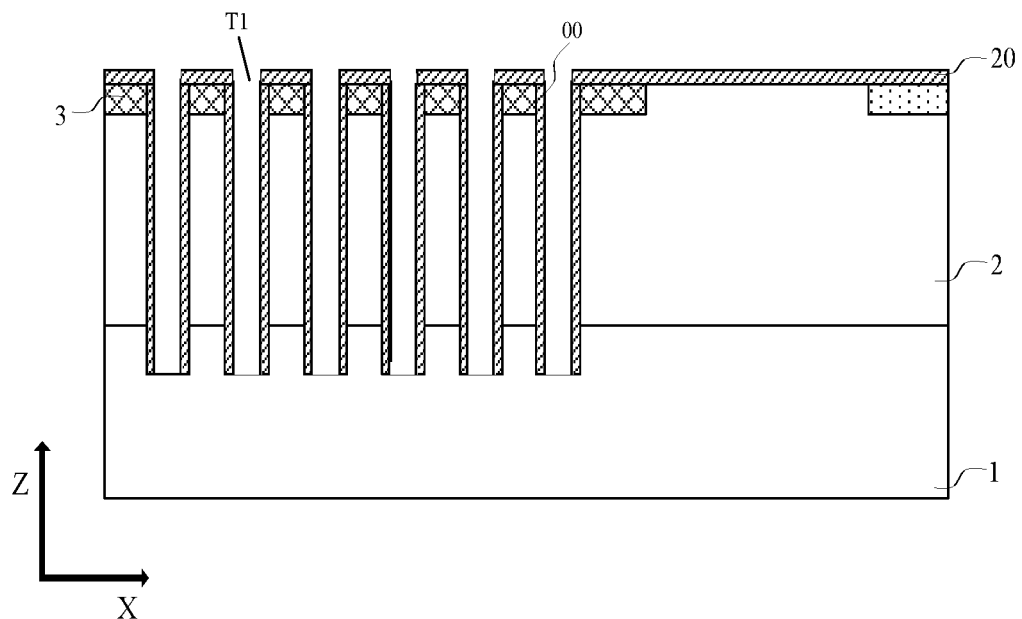
Figure 18:
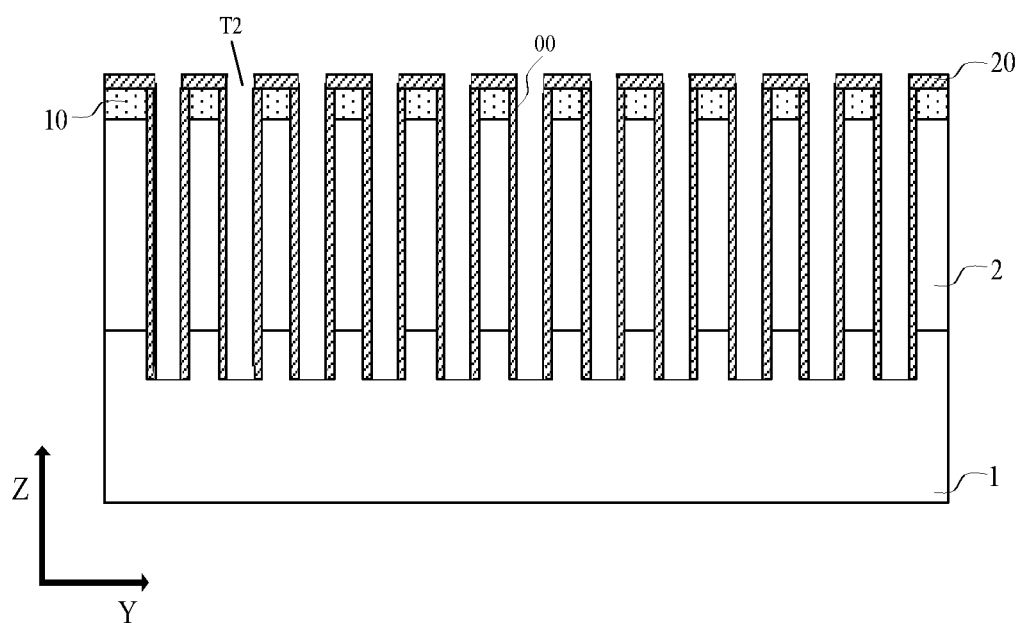
Figure 19:
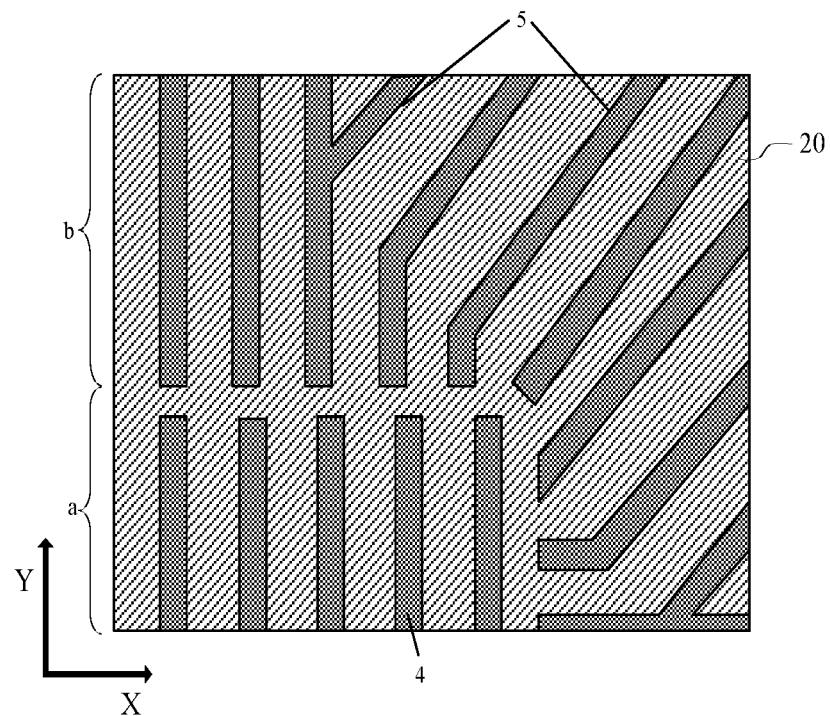
Figure 20:
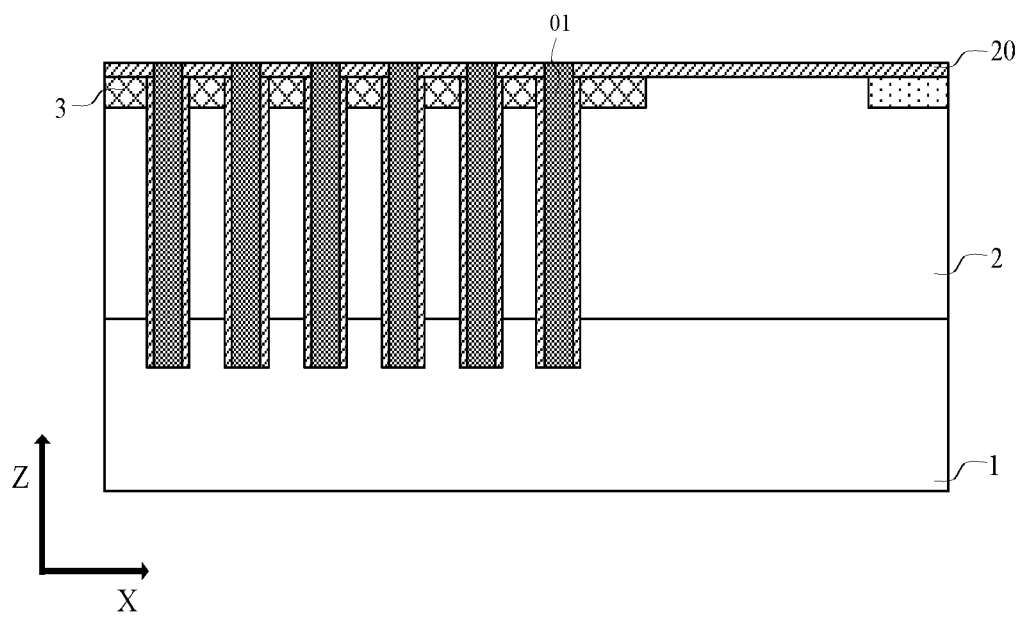
Figure 21:
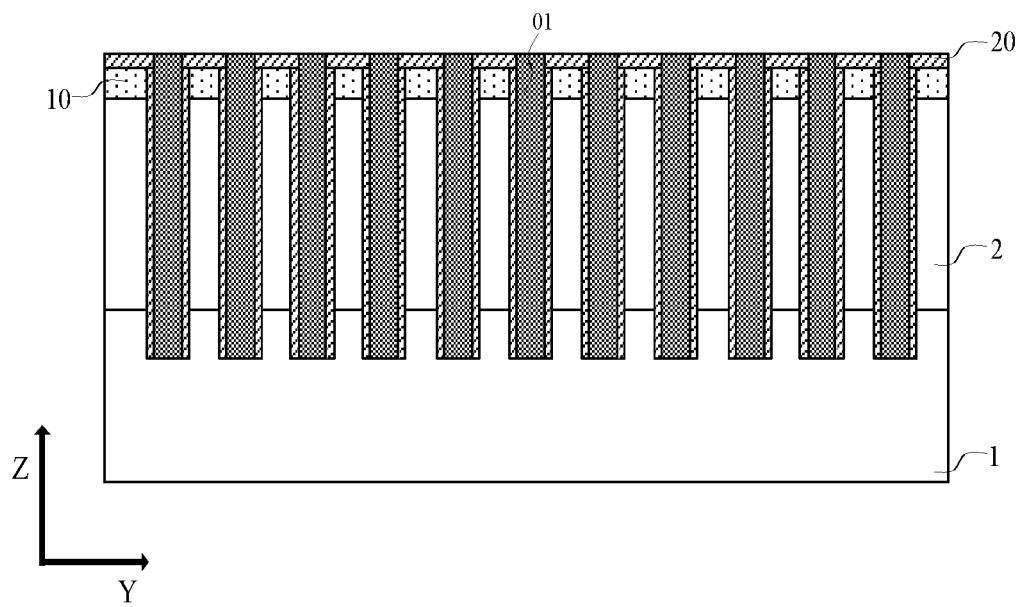
Figure 22:
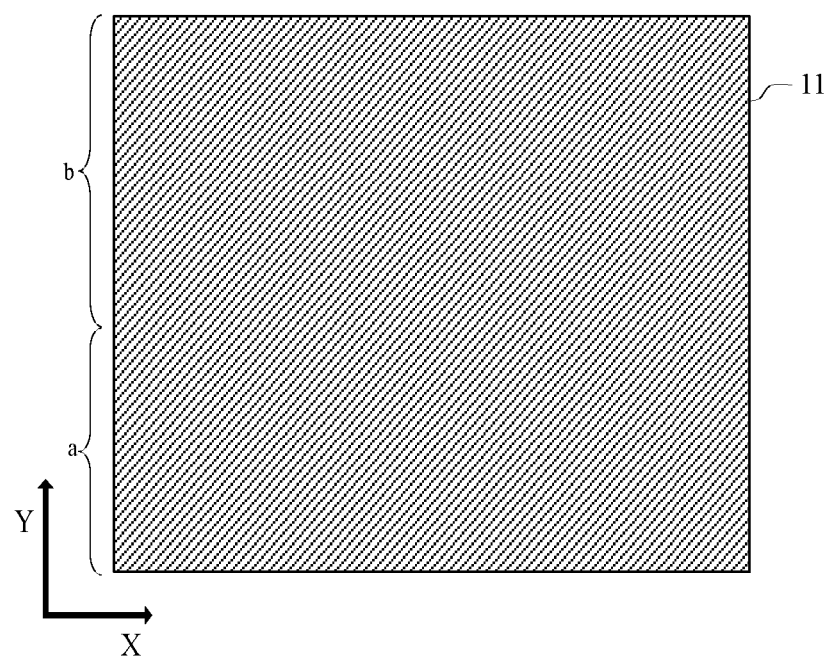
Figure 23:
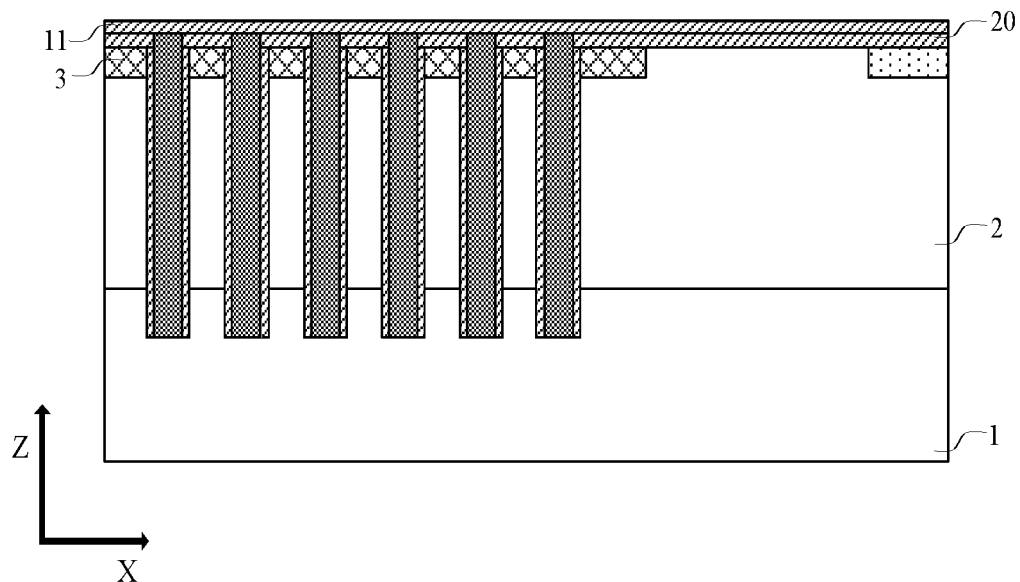
Figure 24:
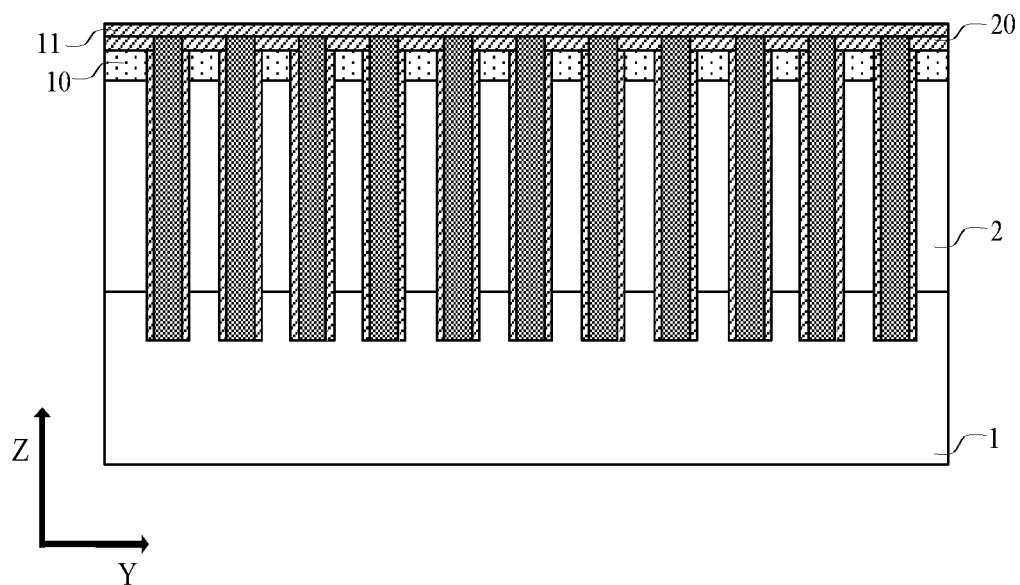

In some embodiments, please refer to FIG. 15 through FIG. 21. Forming the first resistive field plate structure 4 in the first trench T1 and forming the second resistive field plate structure 5 in the second trench T2 further includes:

S41: please refer to FIG. 15 through FIG. 16, forming a field plate dielectric layer 00 in the first trench T1 and the second trench T2 respectively;

S42: please refer to FIG. 17 through FIG. 18, removing the field plate dielectric layer 00 at a bottom of the first trench T1 and a bottom of the second trench T2;

S43: please refer to FIG. 19 through FIG. 21, filling the first trench T1 and the second trench T2 with semi-insulating polysilicon material 01 respectively, the semi-insulating polysilicon material 01 in the first trench T1 and the field plate dielectric layer 00 at a sidewall in the first trench T1 constitute the first resistive field plate structure 4, and the semi-insulating polysilicon material 01 in the second trench T2 and the field plate dielectric layer 00 at the sidewall in the second trench T2 constitute the second resistive field plate structure 5.

In some embodiments, please refer to FIG. 15 through FIG. 16. In S41, a common process is used to oxidize the bottom and side walls of the first trench T1 and the second trench T2 to obtain a field plate dielectric layer 00, such as wet oxidation at 950° C. for 90 minutes to obtain the field plate dielectric layer 00 with a thickness of about 200 nm±10 nm.

In some embodiments, please refer to FIG. 17 through FIG. 18. In S42, anisotropic dry etching is used to remove the field plate dielectric layers 00 at the bottom of the first trench T1 and the second trench T2, but the field plate dielectric layers 00 on the side walls of the first trench T1 and the second trench T2 are retained.

In some embodiments, please refer to FIG. 19 through FIG. 21. In S43, the first trench T1 and the second trench T2 are filled with semi-insulating polysilicon material 01, such as using a process of a low-pressure chemical vapor deposition, with a deposition thickness of 1.1 µm±0.1 µm. The semi-insulating polysilicon material 01 except for the semi-insulating polysilicon material 01 in the first trench T1 and the second trench T2 is removed, or a photolithography plate is used to preserve the semi-insulating polysilicon material 01 on a surface between the second electrode 7 and the third electrode 8 in the termination region b from being reversely etched away (not shown in the figure).

Figure 25:
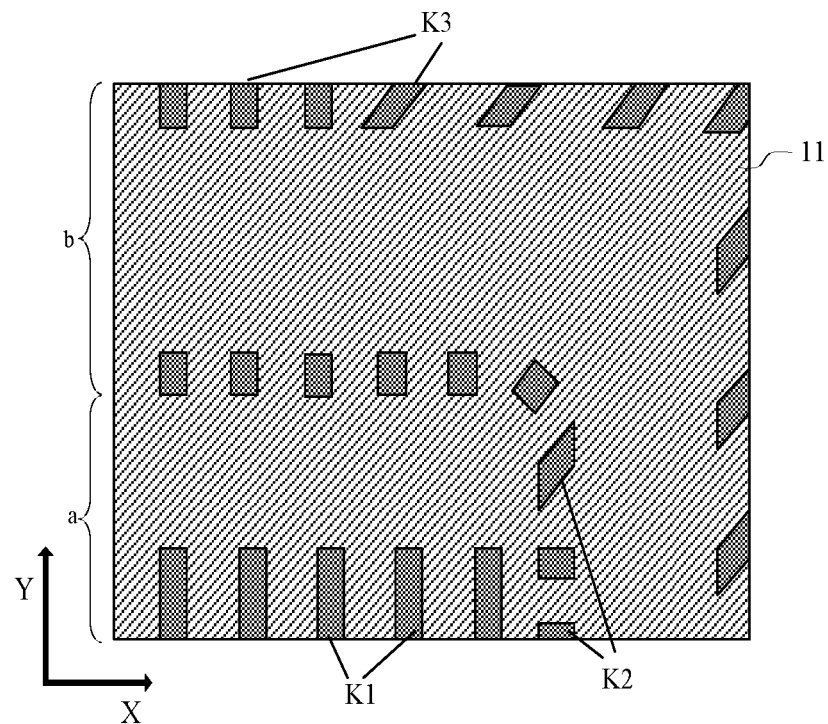
Figure 26:
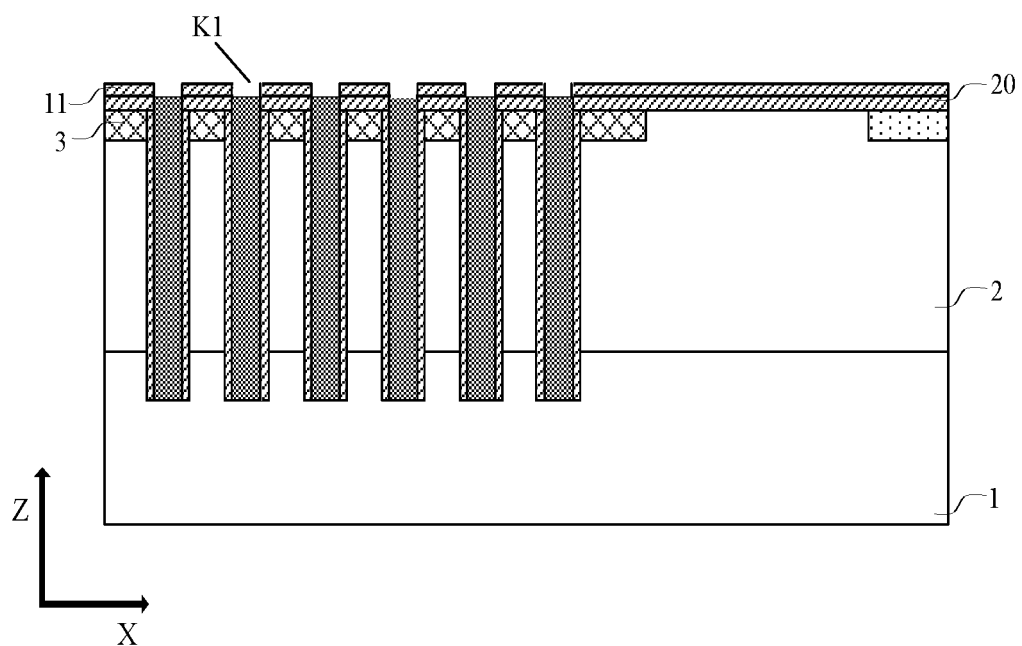
Figure 27:
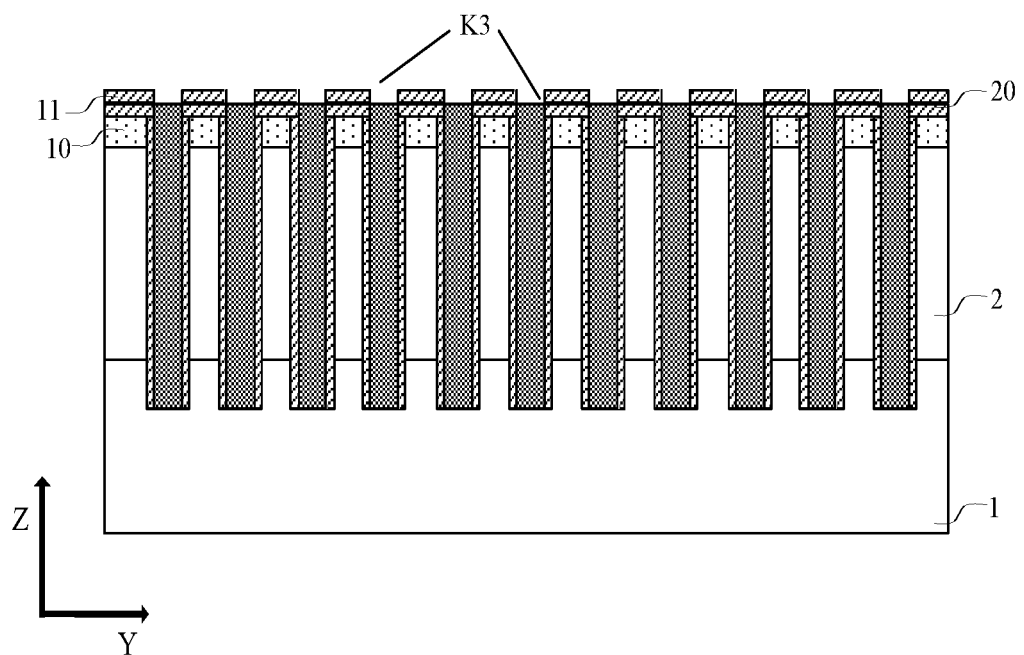
Figure 28:
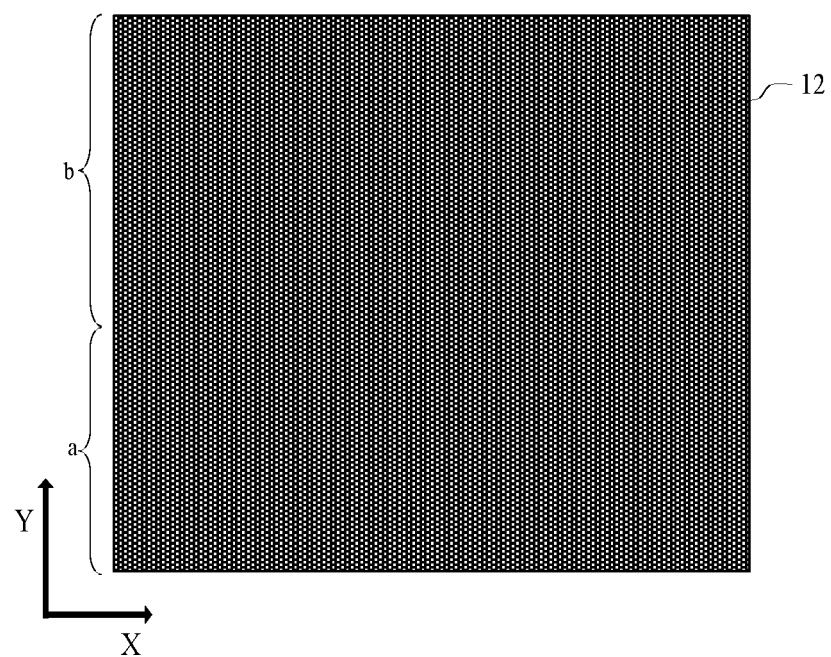
Figure 29:
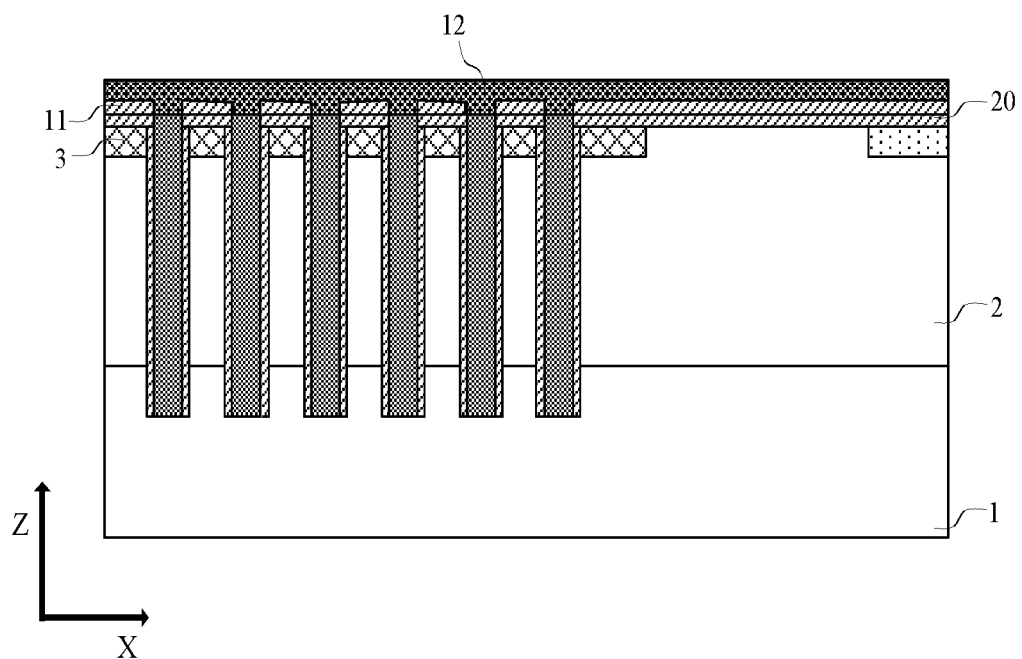
Figure 30:
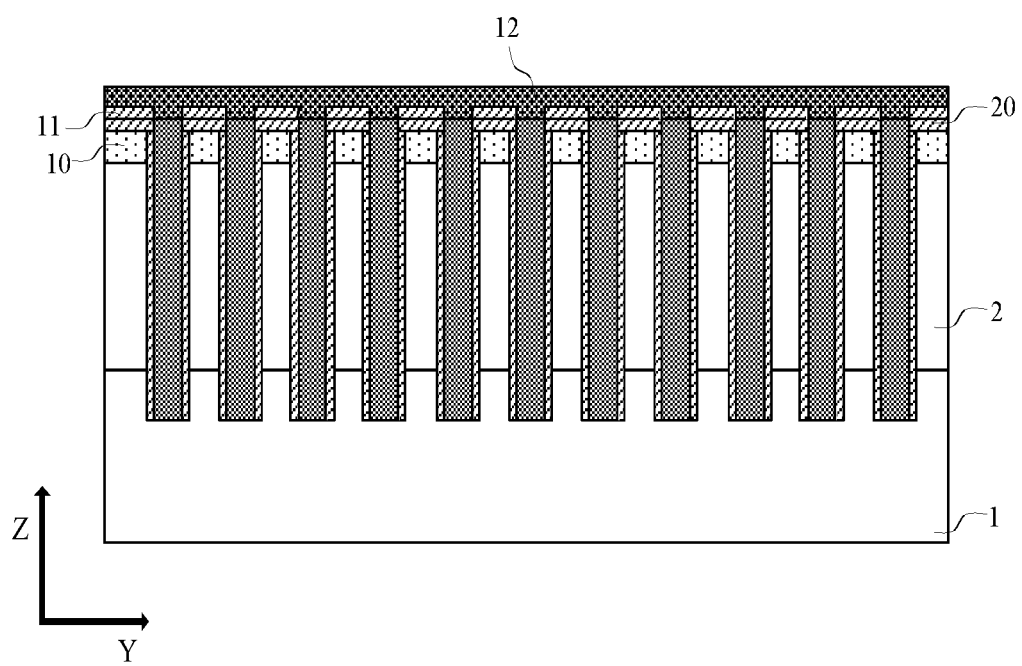
Figure 31:
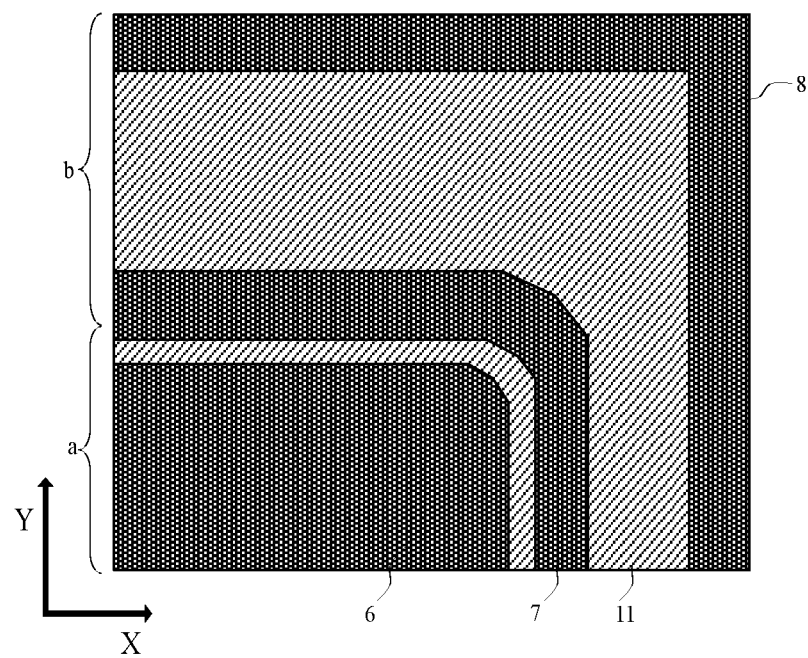
Figure 37:
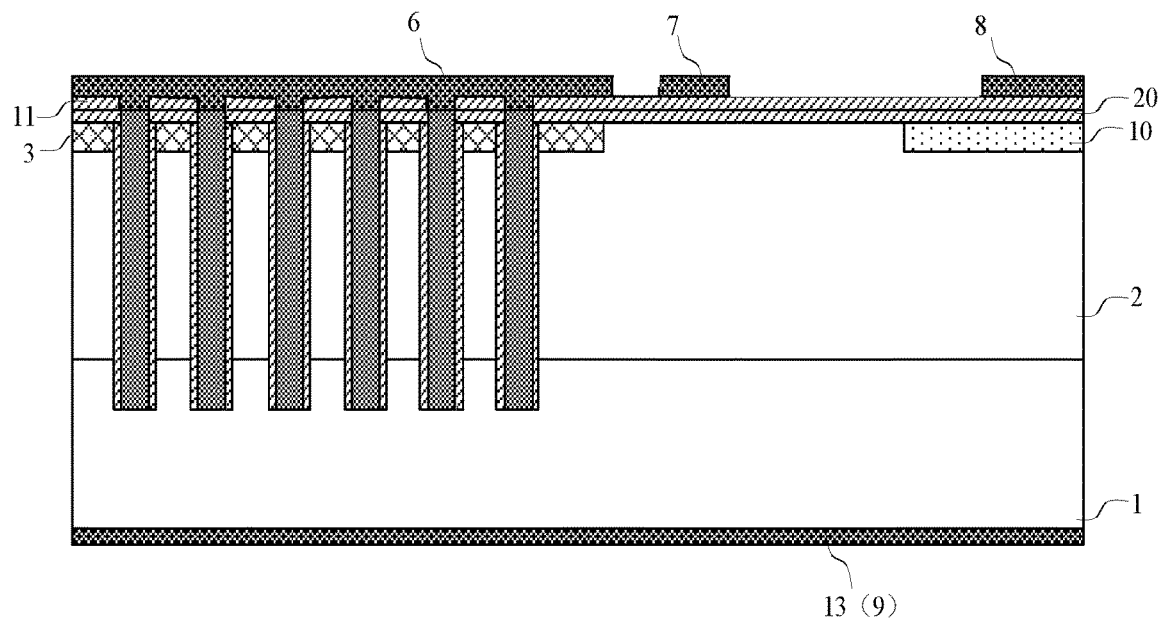
Figure 38:
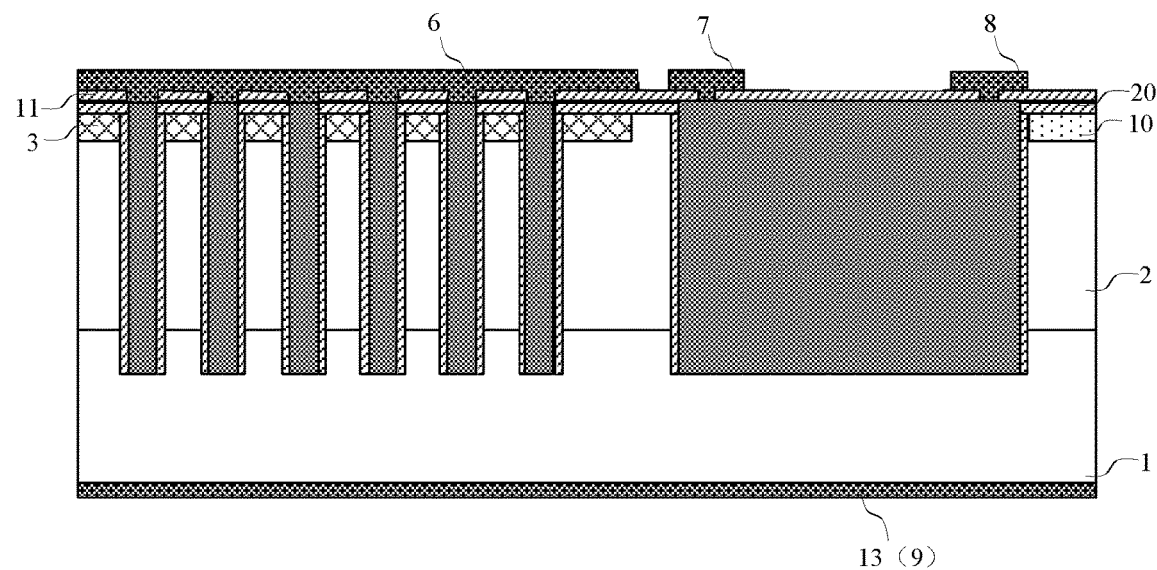
Figure 39:
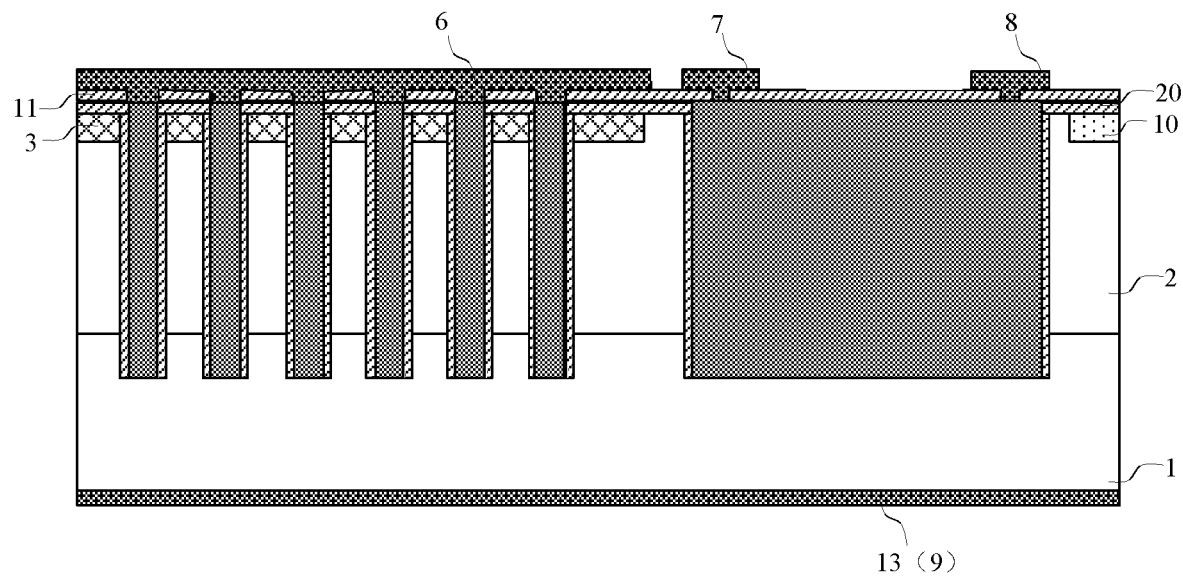

In some embodiments, please refer to FIG. 22 through FIG. 39. S5 of forming the first electrode 6, the second electrode 7 and the third electrode 8 independent of each other on the epitaxial layer 2 and forming the fourth electrode 9 on the back side of the substrate 1 further includes:

S51: Please refer to FIG. 22 through FIG. 24, forming an isolation dielectric layer 11 on the epitaxial layer 2;

S52: please refer to FIG. 25 through FIG. 27, etching the isolation dielectric layer 11, forming a plurality of first openings K1 on the cell region a of the epitaxial layer 2, forming a second opening K2 and a third opening K3 independent of each other on the termination region b of the epitaxial layer 2, the third opening K3 surrounding the second opening K2, the plurality of first openings K1 exposing tops of the plurality of the first resistive field plate structures 4 in one-to-one correspondence, and the second opening K2 and the third opening K3 respectively exposing tops of the second resistive field plate structures 5;

S53: please refer to FIG. 28 through FIG. 30, forming a first metal layer 12 on the isolation dielectric layer 11;

S54: please refer to FIG. 31 through FIG. 36, etching the first metal layer 12, forming the first electrode 6, the second electrode 7 and the third electrode 8, the first electrode 6 ohmically contacting with the top of each of the first resistive field plate structures 4 through the first opening K1, the second electrode 7 ohmically contacting with the top of each of the second resistive field plate structures 5 through the second opening K2, the third electrode 8 ohmically contacting with the top of each of the second resistive field plate structures 5 through the third opening K3;

S55: please refer to FIG. 37 through FIG. 39, forming a second metal layer 13 on the back side of the substrate 1 to obtain the fourth electrode 9, the fourth electrode 9 ohmically contacting with a bottom of each of the first resistive field plate structures 4 and a bottom of each of the second resistive field plate structures 5 through the substrate 1 respectively.

In S54, please refer to FIG. 31 through FIG. 36, the plurality of first openings K1 extend along the second direction in the first plane, and the plurality of first openings K1 are arranged at intervals along the third direction in the first plane. In the first plane, a minimum distance between the third opening K3 and the second opening K2 is greater than or equal to a size L1 of the first resistive field plate structure 4 along the first direction.

Figure 32:
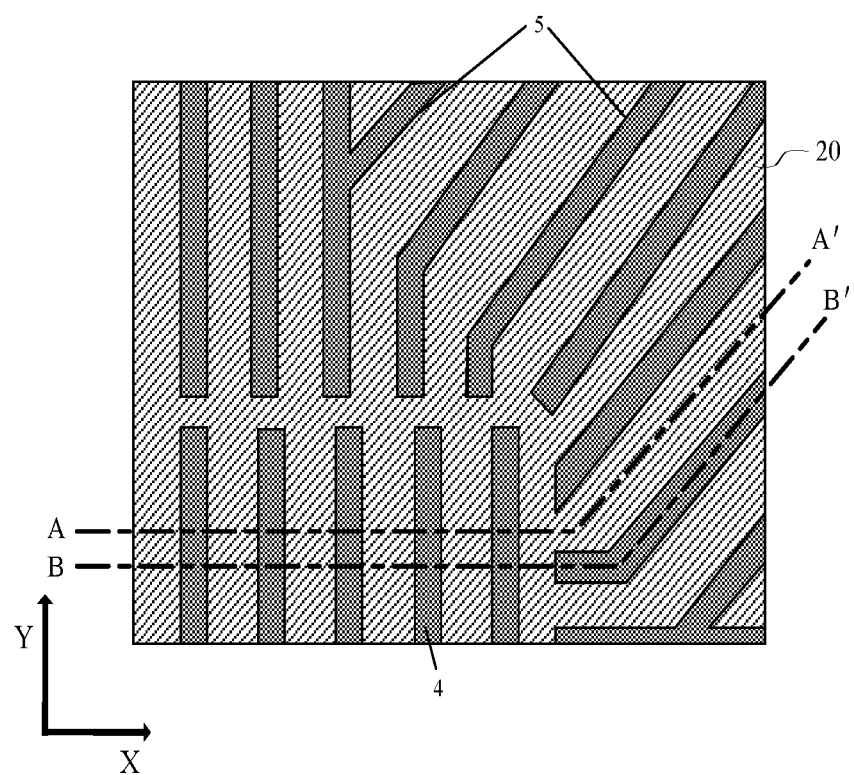
Figure 33:
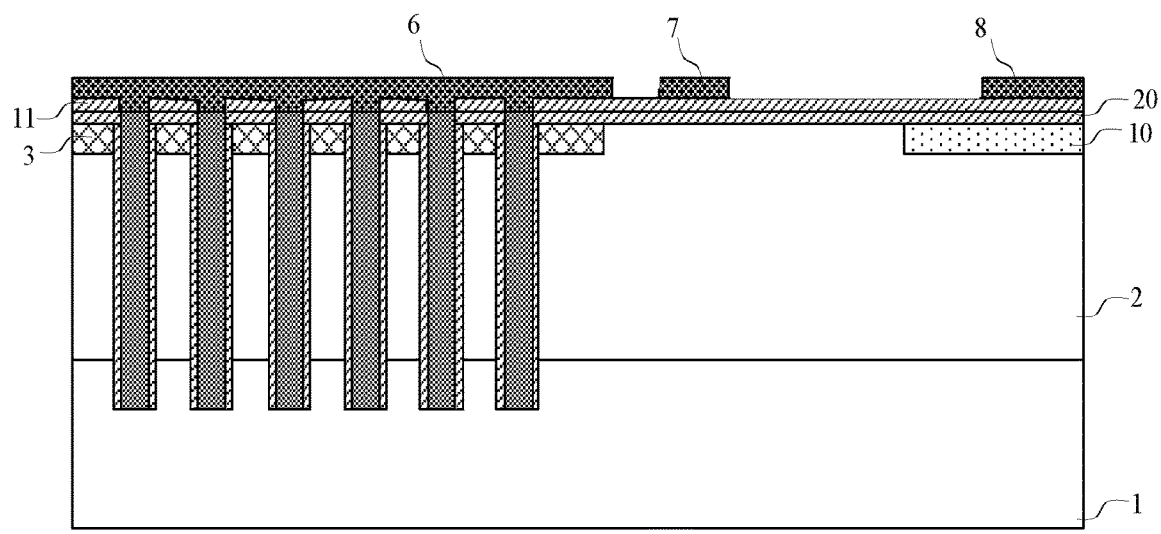
Figure 34:
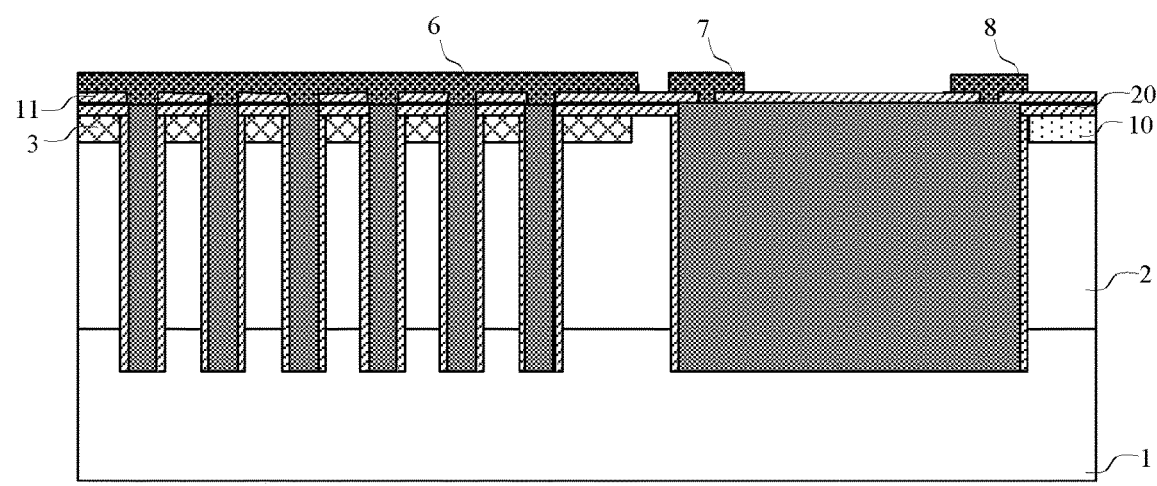
Figure 35:
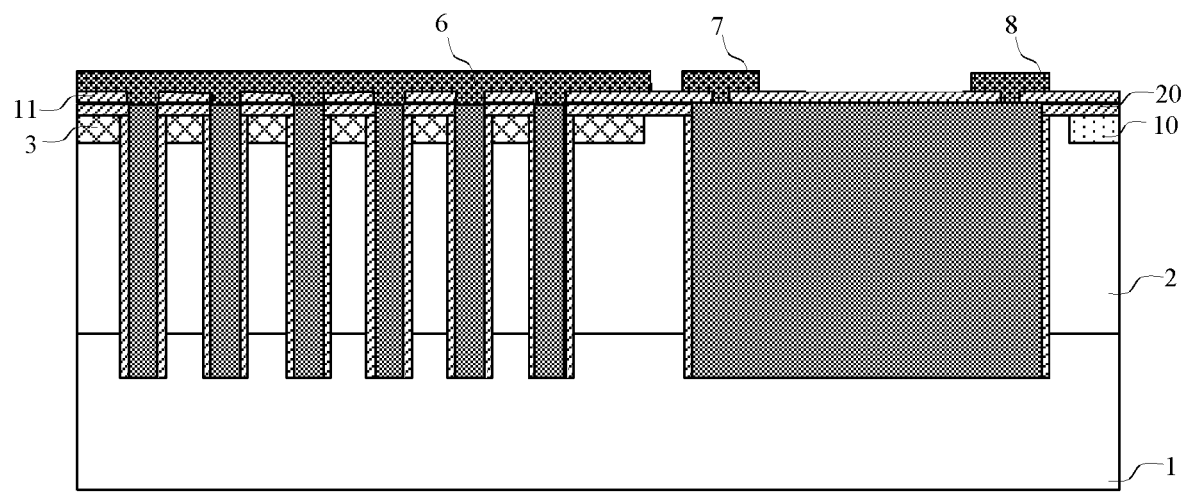
Figure 36:
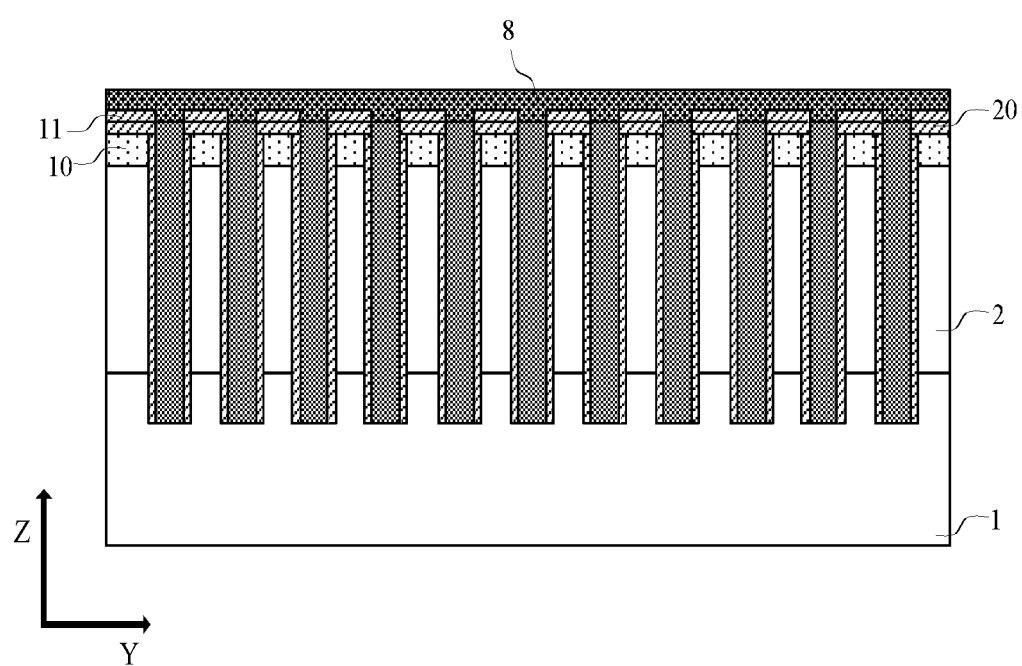

Wherein, FIG. 33 shows a cross-sectional view along AA' in FIG. 32, FIG. 34 and FIG. 35 are cross-sectional views along BB' in FIG. 32, the second resistive field plate structure 5 in FIG. 34 passes through the channel stop layer 10, while the second resistive field plate structure 5 in FIG. 35 does not pass through the channel stop layer 10, these are two different structures, which can be selected according to different situations.

Correspondingly, in S55, FIG. 37 shows a sectional view along AA' in FIG. 32, and FIG. 38 and FIG. 39 are sectional views along BB' in FIG. 32. The second resistive field plate structure 5 in FIG. 38 passes through the channel stop layer 10, while the second resistive field plate structure 5 in FIG. 39 does not pass through the channel stop layer 10. These are two different structures, which can be selected according to different situations.

Finally, the power semiconductor device as shown in FIG. 39 or FIG. 1 is obtained. With the power semiconductor device of the disclosure, the plurality of second resistive field plate structures 5 extending through the epitaxial layer 2 in a first direction into a substrate 1 are arranged in the termination region b of the epitaxial layer 2 and the plurality of second resistive field plate structures 5 are arranged radially in the first plane. The plurality of tightly coupled second resistive field plate structures 5 extending from a side close to the cell region a to a side away from the cell region a form a more uniform three-dimensional electric field distribution diverging around, which optimizes a guiding and binding effect of the termination region b on a charge in a space depletion region of the cell region a, thereby improving the withstand voltage performance of the whole power semiconductor device. The second resistive field plate structure 5 in the termination region b and the first resistive field plate structure 4 in the cell region a are both of a second generation super junction technology based on an internal resistive field plate, which enables a process of the cell region a to be compatible with a process of the termination region b and has low manufacturing cost and low process difficulty. A use of modern 2.5-dimensional machining technology based on deep trench etching is beneficial to a miniaturization and high-density of structures, which is more suitable for a development direction of modern integrated semiconductor devices more than Moore.

It should be noted that the above operation steps are only a sequence for realizing the technical solution of the deep-trench internal resistive field plate power semiconductor device, and other sequences that may also realize similar structures and their own functions are also feasible. For example, S3-S4 of forming the first resistive field plate structure 4 and the second resistive field plate structure 5 may be exchanged with the order of S2, and similar structures and effects may also be obtained without changing other operations. Specific parameters and sequence of the process and other specific implementation sequences and their combinations may obtain almost the same structure and function, which will not be listed here. In addition, well-known and obvious simple processes and conditions such as common cleaning in the industry are omitted in the operation steps of the above embodiments, which are well known to those skilled in the art, and will not be described in detail here.

Embodiment 2

On a basis of Embodiment 1 of the disclosure, in order to further optimize a termination withstand voltage protection effect of the power semiconductor device, a surface semi-insulating polysilicon material 01 between the second electrode 7 and the third electrode 8 in the termination region b may be retained, and a RESURF doping region may also be formed in the termination region b.

Figure 40:
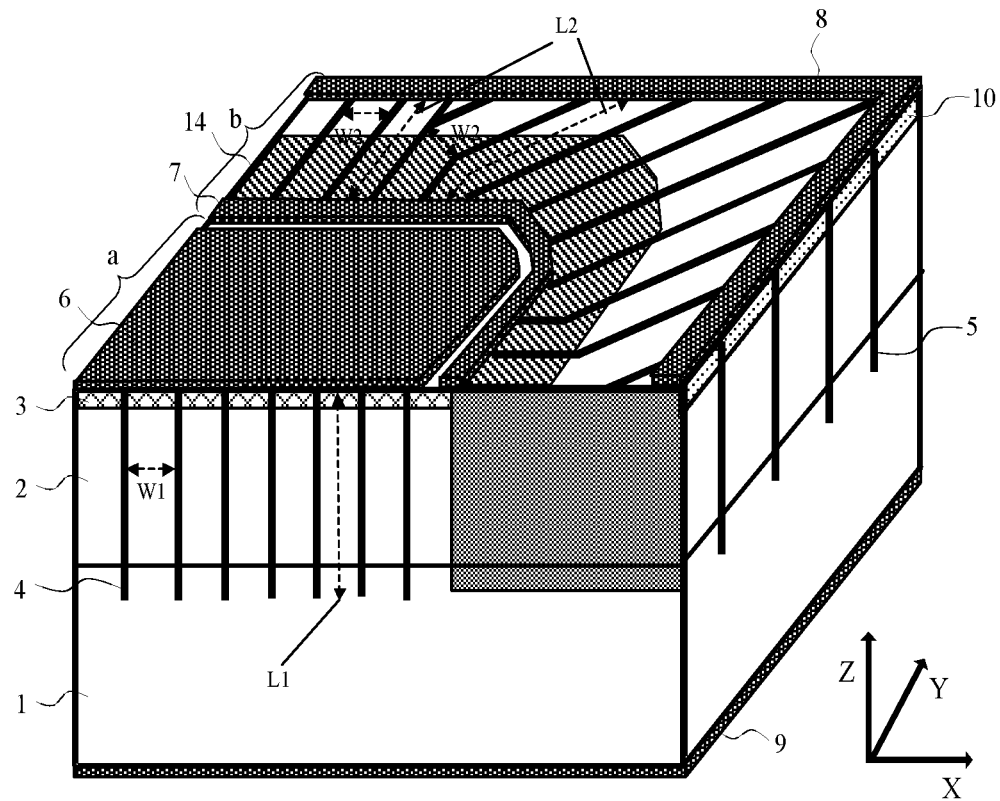
FIG. 40 is a schematic structural view of the power semiconductor device in an embodiment 2 of the disclosure.

In some embodiments, please refer to FIG. 40. The power semiconductor device further includes the RESURF doping region 14. The RESURF doping region 14 is arranged in the termination region b of the epitaxial layer 2 and is located on a top of the epitaxial layer 2, in the first plane, the RESURF doping region 14 surrounds the active region 3, an inner edge of the RESURF doping region 14 overlaps an inner edge of the termination region b, an outer edge of the RESURF doping region is surrounded by an outer edge of the termination region b, which enables a potential of the inner edge of the RESURF doping region 14 to be equal to that of the cell structure in the active region 3, and the outer edge of the RESURF doping region 14 is surrounded by the third electrode 8.

Correspondingly, the disclosure provides the manufacturing method of the power semiconductor device. After providing the substrate 1 and forming the epitaxial layer 2 and before forming the plurality of the first trenches T1 and the plurality of the second trenches T2, the manufacturing method of a power semiconductor device further includes:

Stp1: forming the RESURF doping region 14 in the termination region b of the epitaxial layer 2, in the first plane, the RESURF doping region 14 surrounding the active region 3, the inner edge of the RESURF doping region 14 overlapping the inner edge of the termination region b, and the outer edge of the RESURF doping region 14 being surrounded by the outer edge of the termination region b;

In some embodiments, in Stp1, first the photolithography of the RESURF doped region 14 is performed, the photoresist is used as the shielding mask for boron ion implantation. The implantation conditions are $(2\sim5)\times10^{12}$ cm$^{-2}$, 170 kev. An impurity diffusion and activation is then performed, and the impurity diffusion and activation of the RESURF doped region 14 may be performed simultaneously with a impurity diffusion and activation of the active region 3.

It should be understood that the power semiconductor device further includes at least one of a withstand voltage ring, a resistive field plate, a field plate, and a variable doping termination structure, which is a traditional planar process termination structure used to reduce an edge peak electric field of the PN junction. And it is effective in varying degrees to replace or combine with the RESURF doping region 14 to achieve a similar withstand voltage function.

It should be noted that other structures of the power semiconductor device of the embodiment of the disclosure are the same as those of the first embodiment, and other process operations of the manufacturing method of the power semiconductor device of the embodiment of the disclosure may refer to the first embodiment, which will not be repeated here. In summary the disclosure provides the power semiconductor device and the manufacturing method thereof. The plurality of second resistive field plate structures extending through the epitaxial layer in the first direction into the substrate are arranged in the termination region of the epitaxial layer and the plurality of second resistive field plate structures are arranged radially in the first plane. The plurality of tightly coupled second resistive field plates extending from the side close to the cell region to the side away from the cell region form the more uniform three-dimensional electric field distribution diverging around the cell region, which optimizes the guiding and binding effect of the termination region on the charge in the space depletion region of the cell region, thereby improving the withstand voltage performance of the whole power semiconductor device. The second resistive field plate structure in the termination region and the first resistive field plate structure in the cell region are both of the second generation super junction technology based on the internal resistive field plate, which enables the process of the cell region to be compatible with the process of the termination region and has low manufacturing cost and low process difficulty. The use of modern 2.5-dimensional machining technology based on deep trench etching is beneficial to the miniaturization and high-density design of structures, which is more suitable for the development direction of modern integrated semiconductor devices more than Moore.

The above-mentioned embodiments merely illustrate the principles and effects of the disclosure, but they are not intended to limit the disclosure. Anyone skilled in the art may modify or change the above embodiments without departing from the range of the disclosure. Therefore, all equivalent modifications or changes made by those with ordinary knowledge in the technical field without departing from the range and technical disclosed in the disclosure should still be covered by the claims of the disclosure.

What is claimed is:

1. A manufacturing method of a power semiconductor device, comprising: providing a substrate with a front side and a back side arranged relatively, forming an epitaxial layer on the front side of the substrate, the epitaxial layer comprising a cell region and a termination region adjacently arranged in a first plane, and the termination region surrounding the cell region; forming an active region within the cell region of the epitaxial layer and forming a cell structure in the active region; forming a plurality of first trenches in the cell region of the epitaxial layer, and forming a plurality of second trenches in the termination region of the epitaxial layer, the plurality of the first trenches passing through the active region and the epitaxial layer and entering the substrate along a first direction, and the plurality of the second trenches passing through the epitaxial layer to the substrate along the first direction; forming a first resistive field plate structure in each first trench, and forming a second resistive field plate structure in each second trench; and forming a first electrode, a second electrode and a third electrode independent of each other on the epitaxial layer, forming a fourth electrode on the back side of the substrate, the first electrode ohmically contacting each first resistive field plate structure, the second electrode ohmically contacting each second resistive field plate structure, the third electrode ohmically contacting each second resistive field plate structure, and the fourth electrode ohmically contacting each first resistive field plate structure and each second resistive field plate structure respectively through the substrate, wherein the first plane is parallel to the front side of the substrate, the first direction is perpendicular to the first plane, the plurality of the first trenches and the plurality of the second trenches are formed by the same process.

2. The manufacturing method of the power semiconductor device according to claim 1, wherein
after providing the substrate and forming the epitaxial layer and before forming the plurality of the first trenchs and the plurality of the second trenches, the manufacturing method of the power semiconductor device further comprises:
forming a RESURF doping region in the termination region of the epitaxial layer, in the first plane, the RESURF doping region surrounding the active region, an inner edge of the RESURF doping region overlapping an inner edge of the termination region, and an outer edge of the RESURF doping region being surrounded by an outer edge of the termination region; and
forming a channel stop layer in the termination region of the epitaxial layer, and the channel stop layer overlapping the outer edge of the termination region.

3. The manufacturing method of a power semiconductor device according to claim 1, wherein
the plurality of the first trenches extend along a second direction in the first plane, the plurality of the first trenches are arranged at equal distance along a third direction according to a first distance, the plurality of the second trenches are arranged radially in the first plane, extend from a side close to the cell region to a side away from the cell region, and a minimum distance between two adjacent second trenches is less than or equal to the first distance, wherein the third direction is perpendicular to the second direction.

4. The manufacturing method of the power semiconductor device according to claim 3, wherein
in the first plane, the second trench at a corner of the termination region is set at 45° with the second direction.

5. The manufacturing method of the power semiconductor device according to claim 3, wherein
in the first plane, from a corner of the termination region to a flat edge of the termination region, at least one of the second trenches is in a Y shape.

6. The manufacturing method of the power semiconductor device according to claim 3, wherein
forming the first resistive field plate structure in the first trench and forming the second resistive field plate structure in the second trench further comprises:
forming a field plate dielectric layer in the first trench and the second trench respectively,
removing the field plate dielectric layer at a bottom of the first trench and a bottom of the second trench;
filling the first trench and the second trench with semi-insulating polysilicon material respectively, the semi-insulating polysilicon material in the first trench and the field plate dielectric layer at a sidewall in the first trench constitute the first resistive field plate structure, and the semi-insulating polysilicon material in the second trench and the field plate dielectric layer at the sidewall in the second trench constitute the second resistive field plate structure.

7. The manufacturing method of the power semiconductor device according to claim 6, wherein
forming the first electrode, the second electrode and the third electrode independent of each other on the epitaxial layer and forming the fourth electrode on the back side of the substrate further comprises:
forming an isolation dielectric layer on the epitaxial layer;
etching the isolation dielectric layer, forming a plurality of first openings on the cell region of the epitaxial layer, forming a second opening and a third opening independent of each other on the termination region of the epitaxial layer, the third opening surrounding the second opening, the plurality of the first openings exposing tops of the plurality of the first resistive field plate structures in one-to-one correspondence, and the second opening and the third opening respectively exposing tops of the second resistive field plate structures;
forming a first metal layer on the isolation dielectric layer;
etching the first metal layer, forming the first electrode, the second electrode and the third electrode, the first electrode ohmically contacting with the top of each of the first resistive field plate structures through the first opening, the second electrode ohmically contacting with the top of each of the second resistive field plate structures through the second opening, the third electrode ohmically contacting with the top of each of the second resistive field plate structures through the third opening; and
forming a second metal layer on the back side of the substrate to obtain the fourth electrode, the fourth electrode ohmically contacting with a bottom of each of the first resistive field plate structures and a bottom of each of the second resistive field plate structures through the substrate respectively.

8. The manufacturing method of the power semiconductor device according to claim 7, wherein
the plurality of the first openings extend along the second direction in the first plane, and the plurality of the first openings are arranged at intervals in the first plane along the third direction.

9. The manufacturing method of the power semiconductor device according to claim 7, wherein
in the first plane, a minimum distance between the third opening and the second opening is greater than or equal to a size of the first resistive field plate structure along the first direction.

10. A power semiconductor device prepared by the manufacturing method according to claim 1, comprising:

the substrate with the front side and the back side arranged relatively;

the epitaxial layer, arranged on the front side of the substrate and comprising the cell region and the termination region arranged adjacently in the first plane, and the termination region surrounding the cell region;

the active region, arranged in the cell region and located at the top of the epitaxial layer, and the cell structure being formed therein;

the plurality of first resistive field plate structures, arranged in the cell region of the epitaxial layer, extending through the epitaxial layer in the first direction into the substrate, and extending in the first plane in a second direction;

the plurality of second resistive field plate structures, arranged in the termination region of the epitaxial layer, extending along the first direction through the epitaxial layer into the substrate, arranged radially in the first plane, and extending from a side near the cell region to a side away from the cell region;

the first electrode, arranged on the cell region of the epitaxial layer and ohmically contacting each first resistive field plate structure;

the second electrode, arranged on a side of the termination region of the epitaxial layer near the cell region, ohmically contacting each second resistive field plate structure, and surrounding the first electrode;

the third electrode, arranged on a side of the termination region of the epitaxial layer away from the cell region, ohmically contacting each second resistive field plate structure, and surrounding the second electrode; and the fourth electrode, arranged on the back side of the substrate, ohmically contacting the plurality of the first resistive field plate structures and the plurality of the second resistive field plate structures respectively through the substrate; wherein the first plane is parallel to the front side of the substrate, and the first direction is perpendicular to the first plane.

11. The power semiconductor device according to claim 10, wherein in the first plane, the second resistive field plate structure at a corner of the termination region is set at 45° with the second direction.

12. The power semiconductor device according to claim 10, wherein in the first plane, from a corner of the termination region to a flat edge of the termination region, at least one of the second resistive field plate structures is in a Y shape.

13. The power semiconductor device according to claim 10, wherein in the first plane, a minimum distance between an electrical contact of the third electrode and an electrical contact of the second electrode is greater than or equal to a size of the first resistive field plate structure along the first direction.

14. The power semiconductor device according to claim 10, wherein in the first plane, the plurality of the first resistive field plate structures are arranged in a third direction at equal distance according to a first distance, a minimum distance between two adjacent second resistive field plate structures is less than or equal to the first distance, and the third direction is perpendicular to the second direction.

15. The power semiconductor device according to claim 14, wherein the power semiconductor device further comprises a channel stop layer, the channel stop layer is arranged in the termination region of the epitaxial layer and is located on a top of the epitaxial layer, and a doping type of the channel stop layer is the same as that of the epitaxial layer.

16. The power semiconductor device according to claim 14, wherein the power semiconductor device further comprises a RESURF doping region, the RESURF doping region is arranged in the termination region of the epitaxial layer and is located on a top of the epitaxial layer, in the first plane, the RESURF doping region surrounds the active region, a potential of an inner edge of the RESURF doping region is equal to that of the cell structure in the active region, and an outer edge of the RESURF doping region is surrounded by the third electrode.

17. The power semiconductor device according to claim 14, wherein the power semiconductor device further comprises at least one of a withstand voltage ring, a resistive field plate, a field plate, and a variable doping termination structure.

18. The power semiconductor device according to claim 10, wherein the cell structure at least comprises a diode cell structure, a MOSFET cell structure, a bipolar transistor cell structure and an IGBT cell structure.

* * * * *